(12) United States Patent
Yamazaki et al.

(10) Patent No.: US 9,754,971 B2
(45) Date of Patent: Sep. 5, 2017

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP); Seiko Inoue, Isehara (JP); Daisuke Matsubayashi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 127 days.

(21) Appl. No.: 14/276,356

(22) Filed: May 13, 2014

(65) Prior Publication Data

US 2014/0339543 A1    Nov. 20, 2014

(30) Foreign Application Priority Data

May 18, 2013 (JP) .................................. 2013-105683

(51) Int. Cl.
  *H01L 27/12* (2006.01)
  *H01L 29/786* (2006.01)

(52) U.S. Cl.
  CPC ...... *H01L 27/1225* (2013.01); *H01L 29/7869* (2013.01); *H01L 29/78648* (2013.01)

(58) Field of Classification Search
  CPC .................. H01L 29/4908; H01L 33/36
  See application file for complete search history.

(56) References Cited

U.S. PATENT DOCUMENTS 5,644,147 A    7/1997  Yamazaki et al.
5,731,856 A    3/1998  Kim et al.
(Continued)

FOREIGN PATENT DOCUMENTS

EP    1737044 A    12/2006
EP    2226847 A    9/2010
(Continued)

OTHER PUBLICATIONS http://www.oxforddictionaries.com/us/definition/american_english/cover; 2015.*
(Continued)

*Primary Examiner* — Yu Chen
*Assistant Examiner* — Nilufa Rahim
(74) *Attorney, Agent, or Firm* — Robinson Intellectual Property Law Office; Eric J. Robinson

(57) ABSTRACT

A semiconductor device includes a dual-gate transistor including an oxide semiconductor film between a first gate electrode and a second gate electrode, a gate insulating film between the oxide semiconductor film and the second gate electrode, and a pair of electrodes in contact with the oxide semiconductor film. The semiconductor device further includes an insulating film over the gate insulating film, and a conductive film over the insulating film and connected to one of the pair of electrodes. The insulating film includes an opening in at least a region overlapping with the oxide semiconductor film in which the second gate electrode is provided in contact with the gate insulating film. The second gate electrode is formed using the same material as the conductive film connected to the one of the pair of electrodes.

14 Claims, 19 Drawing Sheets

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,997 B2 | 3/2007 | Tsunoda et al. |
| 7,211,825 B2 | 5/2007 | Shih et al |
| 7,230,601 B2 | 6/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,067,775 B2 | 11/2011 | Miyairi et al. |
| 8,384,080 B2 | 2/2013 | Taniguchi et al. |
| 8,384,085 B2 | 2/2013 | Kimura et al. |
| 8,593,380 B2 | 11/2013 | Huh |
| 8,680,529 B2 | 3/2014 | Kimura |
| 8,692,252 B2 | 4/2014 | Takata et al. |
| 8,853,016 B2* | 10/2014 | Park ................... H01L 27/1225 438/149 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0155573 A1* | 8/2003 | Yamazaki ................ H01L 27/12 257/72 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0129933 A1 | 7/2004 | Nathan et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1* | 3/2009 | Lai ..................... H01L 27/1225 438/23 |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1* | 8/2009 | Son .................. H01L 29/42384 257/43 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0259713 A1* | 10/2010 | Sato .................. G02F 1/133345 349/138 |
| 2011/0204369 A1* | 8/2011 | Ha ..................... H01L 51/5228 257/59 |
| 2011/0266542 A1 | 11/2011 | Ryu et al. |
| 2013/0092920 A1* | 4/2013 | Kim ...................... H01L 27/12 257/40 |
| 2014/0339539 A1 | 11/2014 | Yamazaki et al. |
| 2014/0340608 A1 | 11/2014 | Yamazaki et al. |
| 2015/0236046 A1* | 8/2015 | Park ...................... H01L 27/124 257/72 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2011-124360 | 6/2011 |
| JP | 2011-138934 | 7/2011 |

(56) References Cited

FOREIGN PATENT DOCUMENTS

| | | |
|---|---|---|
| JP | 2012-248829 | 12/2012 |
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Kimizuka.N. et al., "SPINEL, YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner 102 104 108 106

102 104 106 108

109

109

110 112

114

114

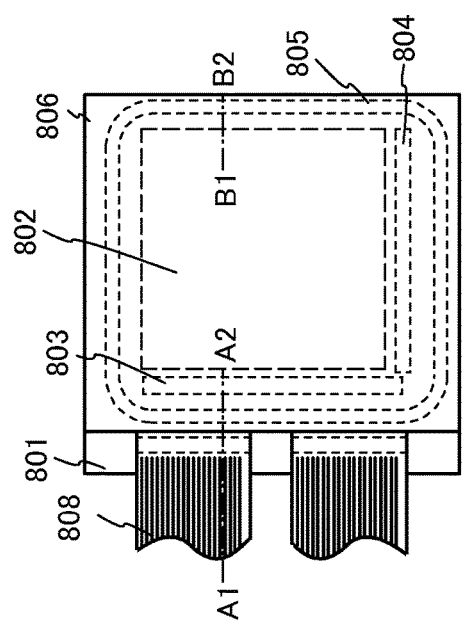
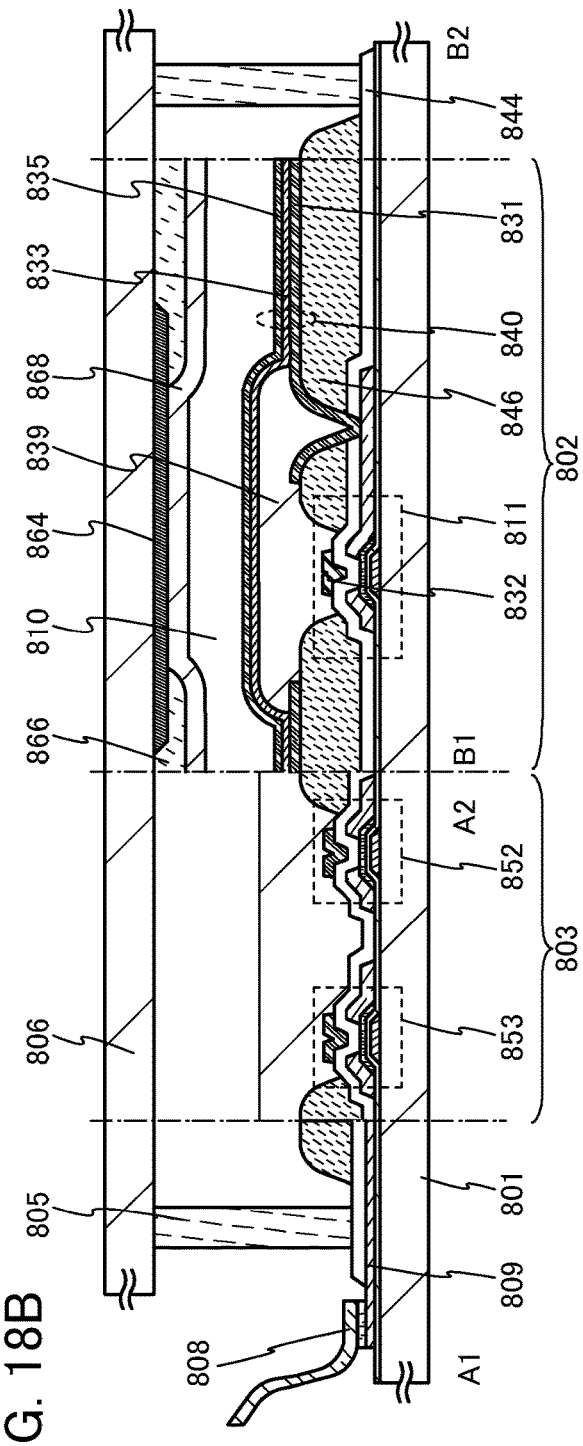
FIG. 18A
FIG. 18B

SEMICONDUCTOR DEVICE

BACKGROUND OF THE INVENTION

1. Field of the Invention

The present invention relates to a semiconductor device provided with a transistor including an oxide semiconductor film and a method for manufacturing the semiconductor device.

2. Description of the Related Art

Attention has been focused on a technique for forming a transistor with use of a semiconductor thin film formed over a substrate (the transistor is also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an oxide semiconductor containing indium (In), gallium (Ga), and zinc (Zn) as an active layer is disclosed (see Patent Document 1).

Further, a technique of improving carrier mobility by forming stacked oxide semiconductor layers has been disclosed (see Patent Documents 2 and 3).

REFERENCE

Patent Documents

[Patent Document 1] Japanese Published Patent Application No. 2006-165528
[Patent Document 2] Japanese Published Patent Application No. 2011-138934
[Patent Document 3] Japanese Published Patent Application No. 2011-124360

SUMMARY OF THE INVENTION

One embodiment of the present invention is to provide a semiconductor device including a transistor having excellent electric characteristics (e.g., on-state current, field-effect mobility, frequency characteristics, and the like). Furthermore, a semiconductor device including a highly reliable transistor is provided.

One embodiment of the present invention is a semiconductor device including a dual-gate transistor including an oxide semiconductor film between a first gate electrode and a second gate electrode, a gate insulating film between the oxide semiconductor film and the first gate electrode or the second gate electrode, and a pair of electrodes in contact with the oxide semiconductor film. The semiconductor device further includes a conductive film connected to one of the pair of electrodes. The gate insulating film and an insulating film are stacked between one of the pair of electrodes and the conductive film. The insulating film includes an opening in at least a region overlapping the oxide semiconductor film. The first gate electrode or the second gate electrode is in contact with the gate insulating film in the opening of the insulating film. The first gate electrode or the second gate electrode is formed using the same material as the conductive film connected to one of the pair of electrodes.

Note that the gate insulating film is etched. In the channel width direction of the transistor, the first gate electrode or the second gate electrode may face the side surface of the oxide semiconductor film with the gate insulating film provided therebetween.

The gate insulating film may include openings not overlapping the oxide semiconductor film and on two opposite sides of the oxide semiconductor film. In the channel width direction of the transistor, the second gate electrode formed in the openings may face the side surface of the oxide semiconductor film with the gate insulating film provided therebetween.

Note that the gate insulating film may be formed using an inorganic insulating film. The insulating film provided between one of the pair of electrodes and the conductive film may be formed using an organic insulating film.

One embodiment of the present invention is a semiconductor device including a transistor including a first gate electrode; an oxide semiconductor film overlapping the first gate electrode; a first barrier film against oxygen, between the first gate electrode and the oxide semiconductor film; a pair of electrodes in contact with the oxide semiconductor film; an oxide insulating film in contact with the oxide semiconductor film; a second barrier film against oxygen, the second barrier film being in contact with the first barrier film against oxygen and the oxide insulating film; and a second gate electrode overlapping the oxide semiconductor film with the second barrier film against oxygen provided therebetween. The oxide semiconductor film and the oxide insulating film are provided between the first barrier film against oxygen and the second barrier film against oxygen. The semiconductor device further includes an insulating film which is in contact with the second barrier film against oxygen and which includes a first opening overlapping with the oxide semiconductor film. The semiconductor device further includes a conductive film connected to one of the pair of electrodes in at least a second opening provided in the second barrier film against oxygen and the insulating film. The second gate electrode is in contact with the second barrier film against oxygen and overlaps the oxide semiconductor film in a region overlapping with the first opening. The second gate electrode and the conductive film are formed using the same material.

Note that the first barrier film against oxygen serves as a first gate insulating film. The oxide insulating film and the second barrier film against oxygen serve as a second gate insulating film.

A capacitor including a film having conductivity over the first barrier film against oxygen, the second barrier film against oxygen which is in contact with the film having conductivity, and the conductive film may be formed.

The oxide insulating film and the second bather film against oxygen may be formed using an inorganic insulating film. The insulating film provided between one of the pair of electrodes and the conductive film may be formed using an organic insulating film.

In the channel width direction of the transistor, the second gate electrode may face the side surface of the oxide semiconductor film with the oxide insulating film and the second barrier film against oxygen provided therebetween.

The oxide insulating film may include an oxide insulating film containing more oxygen than that in the stoichiometric composition. The oxide insulating film containing more oxygen than that in the stoichiometric composition is an oxide insulating film of which the amount of released oxygen converted into oxygen atoms is greater than or equal to $1.0 \times 10^{18}$ atoms/cm$^3$ in TDS analysis performed at surface temperatures comprised between 100° C. and 700° C. or between 100° C. and 500° C.

The conductive film may serve as a first electrode. A light-emitting layer may be provided over the conductive film, and a second conductive film serving as a second electrode may be provided over the light-emitting layer. The first electrode, the light-emitting layer, and the second electrode form a light-emitting element.

An insulating film which overlaps a portion of the conductive film which is connected to one of the pair of electrodes and the first gate electrode or the second gate electrode which is in contact with the gate insulating film in the opening of the insulating film may be included. The insulating film serves as a partition wall for separating light-emitting elements.

The first gate electrode and the second gate electrode may be connected to each other.

A channel-etched transistor can be used as the transistor. A distance between the pair of electrodes over the oxide semiconductor film can be greater than or equal to 1 µm and less than 4 µm.

The oxide semiconductor film can be an oxide film including In, M (M represents Al, Ga, Y, Zr, La, Ce, or Nd), and Zn. The oxide semiconductor film can be formed using a sputtering target with an atomic ratio in which a proportion of the In is higher than or equal to a proportion of the M.

One embodiment of the present invention can provide a semiconductor device including a transistor having excellent electric characteristics (e.g., on-state current, field-effect mobility, frequency characteristics, and the like). Furthermore, One embodiment of the present invention can provide a semiconductor device including a highly reliable transistor.

BRIEF DESCRIPTION OF THE DRAWINGS

FIGS. 18A and 18B are a top view and a cross-sectional view illustrating a light-emitting device.

DETAILED DESCRIPTION OF THE INVENTION

Embodiment 1

In this embodiment, a semiconductor device which is one embodiment of the present invention and a manufacturing method thereof are described with reference to drawings.

Figure 1A:
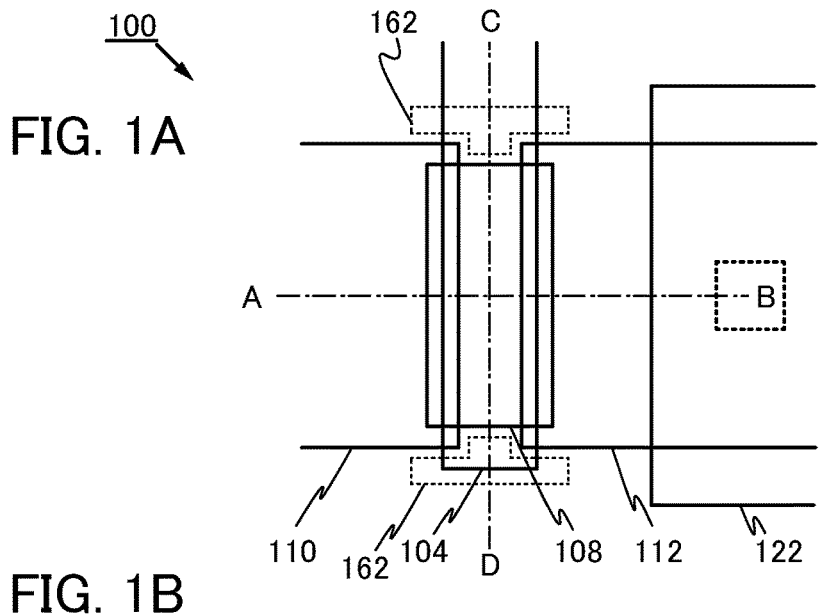
FIGS. 1A to 1C are a top view and cross-sectional views illustrating one embodiment of a transistor.
Figure 1B:
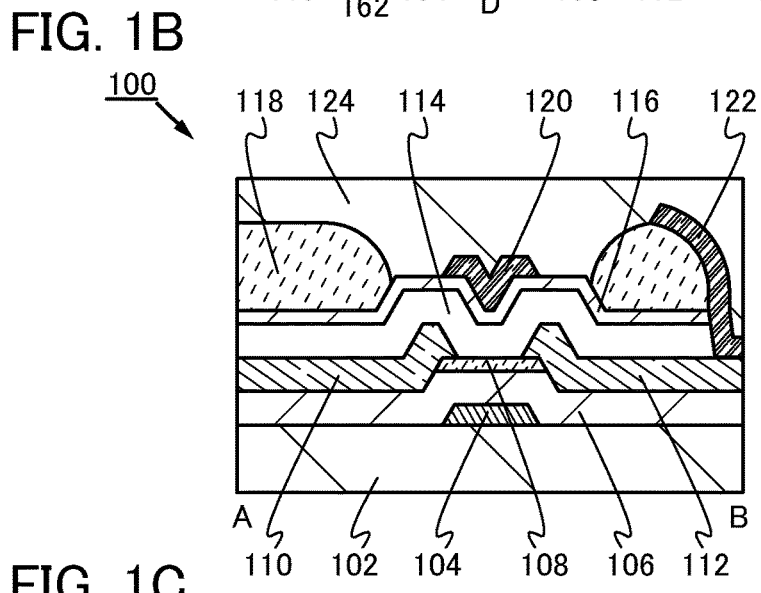
Figure 1C:
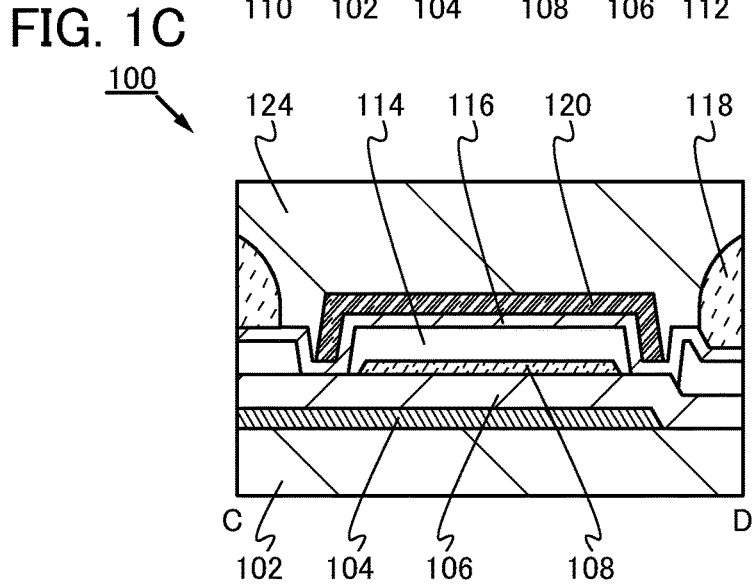

FIGS. 1A to 1C are a top view and cross-sectional views of a transistor 100 included in a semiconductor device. The transistor 100 shown in FIGS. 1A to 1C is a channel-etched transistor. FIG. 1A is a top view of the transistor 100, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 102, a gate insulating film 106, and the like are omitted for simplicity.

The transistor 100 illustrated in FIGS. 1B and 1C includes a gate electrode 104 provided over the substrate 102. Moreover, the gate insulating film 106 over the substrate 102 and the gate electrode 104, an oxide semiconductor film 108 overlapping the gate electrode 104 with the gate insulating film 106 provided therebetween, and a pair of electrodes 110 and 112 which are in contact with the oxide semiconductor film 108 are included. An oxide insulating film 114 and a nitride insulating film 116 are formed over the gate insulating film 106, the oxide semiconductor film 108, and the pair of electrodes 110 and 112. The oxide insulating film 114 and the nitride insulating film 116 serve as a protective film of the transistor 100 and also serve as a second gate insulating film of the transistor 100.

A gate electrode 120 is formed over the oxide insulating film 114 and the nitride insulating film 116 serving as a second gate insulating film. An insulating film 118 having a first opening is formed in contact with the nitride insulating film 116 serving as a part of a second gate insulating film. The insulating film 118 is formed so that the oxide semiconductor film 108 is positioned in a region overlapping with the first opening. A second opening is provided in the insulating film 118, and the oxide insulating film 114 and the nitride insulating film 116 serving as a second gate insulating film; the second opening reaches the electrode 112. A conductive film 122 is connected to one of the pair of electrodes 110 and 112 (in this structure, connected to the electrode 112). The conductive film 122 is formed to cover the insulating film 118. Note that the conductive film 122 serves as a pixel electrode.

Note that the gate electrode 120 is provided to be in contact with the nitride insulating film 116 serving as a part of a second gate insulating film and to overlap the oxide semiconductor film 108 in a region overlapping with the first opening provided in the insulating film 118. The gate electrode 120 and the conductive film 122 are formed in the same step; that is, the gate electrode 120 and the conductive film 122 are formed using the same material.

An insulating film 124 is formed over the nitride insulating film 116, the insulating film 118, the gate electrode 120, and the conductive film 122. Note that the insulating film 124 serves as a partition wall for isolation between light-emitting elements formed over the semiconductor device of one embodiment of the present invention.

In the transistor 100 described in this embodiment, the oxide semiconductor film 108 is provided between the gate electrode 104 and the gate electrode 120. The oxide insulating film 114 and the nitride insulating film 116 serving as a second gate insulating film are etched and overlap the oxide semiconductor film 108. Specifically, in a channel length direction of the transistor 100 shown in FIG. 1B, end portions of the oxide insulating film 114 and the nitride insulating film 116 serving as a second gate insulating film are positioned over the electrode 112. In a channel width direction of the transistor 100 shown in FIG. 1C, end portions of the oxide insulating film 114 and the nitride insulating film 116 are positioned beyond outer sides of the oxide semiconductor film 108. In the channel width direction of the transistor 100 shown in FIG. 1C, the gate electrode 120 faces a side surface of the oxide semiconductor film 108, with the oxide insulating film 114 and the nitride insulating film 116 serving as a second gate insulating film provided therebetween.

The oxide semiconductor film 108 is typically formed using In—Ga oxide, In—Zn oxide, In-M-Zn oxide (M represents Al, Ga, Y, Zr, La, Ce, or Nd), or the like.

Defects are formed at an end portion of the oxide semiconductor film processed by etching or the like because of damage due to the processing, and the end portion of the oxide semiconductor film is polluted by attachment of impurities, or the like. Thus, when stress such as an electric field is applied, the end portion of the oxide semiconductor film is easily activated to be n-type (have low resistance). Therefore, in this embodiment, end portions of the oxide semiconductor film 108 that overlap the gate electrode 104 are likely to be n-type. When the n-type end portions of the oxide semiconductor film 108 are provided between the pair of electrodes 110 and 112, the n-type regions serve as carrier paths, resulting in formation of a parasitic channel. However, as illustrated in FIG. 1C, when the gate electrode 120 faces the side surface of the oxide semiconductor film 108 with the side surfaces of the oxide insulating film 114 and the nitride insulating film 116 serving as a second gate insulating film provided therebetween in the channel width direction, formation of a parasitic channel at the side surface of the oxide semiconductor film 108 and its vicinity is suppressed because of an electric field of the gate electrode 120. As a result, the transistor has excellent electrical characteristics in which drain current is drastically increased at the threshold voltage.

Further, an electric field from the outside can be blocked by the gate electrodes 104 and 120; thus, charges of charged particles and the like that are formed between the substrate 102 and the gate electrode 104 and over the gate electrode 120 do not affect the oxide semiconductor film 108. Therefore, degradation due to a stress test (e.g., a negative gate bias temperature (−GBT) stress test) can be reduced, and changes in the rising voltages of on-state current at different drain voltages can be suppressed. Note that this effect is caused when the gate electrodes 104 and 120 have the same potential or different potentials.

The BT stress test is one kind of accelerated test and can evaluate, in a short time, change in characteristics (i.e., a change over time) of transistors, which is caused by long-term use. In particular, the amount of change in threshold voltage of the transistor between before and after the BT stress test is an important indicator when examining the reliability of the transistor. As the amount of change in the threshold voltage between before and after the BT stress test is small, the transistor has high reliability.

Next, a specific method of the BT stress test is described. First, initial characteristics of the transistor are measured. Next, the temperature of the substrate over which the transistor is formed (substrate temperature) is set at fixed temperature, the pair of electrodes serving as a source and a drain of the transistor are set at the same potential, and the gate electrode is supplied for a certain period with a potential different from that of the pair of electrodes serving as a source and a drain. The substrate temperature may be determined as appropriate in accordance with the test purpose. Then, the substrate temperature is set at a temperature similar to that of a temperature when the initial characteristics are measured, and electrical characteristics of the transistor are measured again. As a result, a difference between the threshold voltage in the initial characteristics and the threshold voltage in the electrical characteristics after the BT stress test can be obtained as the amount of change in the threshold voltage.

Note that the test in the case where the potential applied to the gate electrode is higher than the potential of the source and the drain is referred to as a positive GBT stress test, and the test in the case where the potential applied to the gate electrode is lower than the potential of the source and the drain is referred to as a negative GBT stress test. A BT stress test with light irradiation is referred to as a GBT photostress test. The test in the case where light irradiation is performed and the potential applied to the gate electrode is higher than the potential of the source and the drain is referred to as a positive GBT photostress test, and the test in the case where light irradiation is performed and the potential applied to the gate electrode is lower than the potential of the source and the drain is referred to as a negative GBT photostress test.

With the gate electrodes 104 and 120 having the same potential, the amount of change in the threshold voltage is reduced. Accordingly, variation in electrical characteristics among a plurality of transistors is also reduced. Further, in the oxide semiconductor film 108, a region in which carriers flow is increased in the film thickness direction; thus, the amount of transferred carriers is increased. As a result, the on-state current of the transistor 100 is increased and the field-effect mobility is increased. Typically, the field-effect mobility is greater than or equal to 20 cm$^2$/V·s.

Further, the oxide insulating film 114 over the oxide semiconductor film 108 includes an oxide insulating film containing a higher proportion of oxygen than that of oxygen in the stoichiometric composition. Part of oxygen is released by heating from the oxide insulating film containing a higher proportion of oxygen than that of oxygen in the stoichiometric composition. The oxide insulating film containing a higher proportion of oxygen than that of oxygen in the stoichiometric composition is an oxide insulating film of which the amount of released oxygen converted into oxygen atoms is greater than or equal to $1.0\times10^{18}$ atoms/cm$^3$, or greater than or equal to $3.0\times10^{20}$ atoms/cm$^3$ in TDS analysis performed at surface temperatures comprised between 100° C. and 700° C. or between 100° C. and 500° C. Note that the oxide insulating film 114 may be formed in two steps under different formation conditions.

In the case where the oxide insulating film 114 includes the oxide insulating film containing a higher proportion of oxygen than that of oxygen in the stoichiometric composition, part of oxygen contained in the oxide insulating film 114 can be transferred to the oxide semiconductor film 108 to reduce oxygen vacancies in the oxide semiconductor film 108.

In a transistor formed using an oxide semiconductor film including oxygen vacancies, the threshold voltage is likely to shift in the negative direction to have normally-on characteristics. This is because charges are generated owing to oxygen vacancies in the oxide semiconductor film and the resistance is thus reduced. The transistor having normally-on characteristics causes various problems in that malfunction is likely to be caused when in operation and that power consumption is increased when not in operation. Further, there is a problem in that the amount of change in electrical characteristics, typically in threshold voltage, of the transistor is increased by a change over time or a stress test.

However, in the transistor 100 described in this embodiment, the oxide insulating film 114 over the oxide semiconductor film 108 includes an oxide insulating film containing a higher proportion of oxygen than that of oxygen in the stoichiometric composition. Thus, oxygen contained in the oxide insulating film 114 can be transferred to the oxide semiconductor film 108 to reduce oxygen vacancies in the oxide semiconductor film 108. As a result, the transistor has normally-off characteristics. Further, the amount of change in electrical characteristics, typically in threshold voltage, of the transistor due to a change over time or a stress test can be reduced.

Other details of the transistor 100 are described below.

There is no particular limitation on the property of a material and the like of the substrate 102 as long as the material has heat resistance enough to withstand at least later heat treatment. For example, a glass substrate, a ceramic substrate, a quartz substrate, or a sapphire substrate may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Furthermore, any of these substrates further provided with a semiconductor element may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In that case, the transistor 100 can be transferred to a substrate having low heat resistance or a flexible substrate.

The gate electrode 104 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. The gate electrode 104 may have a single-layer structure or a layered structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film that contains aluminum and one or more elements selected from titanium, tantalum, tungsten, molybdenum, chromium, neodymium, and scandium may be used.

The gate electrode 104 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

The gate insulating film 106 can be formed to have a single-layer structure or a layered structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film.

The gate insulating film 106 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 106 is greater than or equal to 5 nm and less than or equal to 400 nm, preferably greater than or equal to 10 nm and less than or equal to 300 nm, more preferably greater than or equal to 50 nm and less than or equal to 250 nm.

The oxide semiconductor film 108 is typically In—Ga oxide, In—Zn oxide, or In-M-Zn oxide (M represents Al, Ga, Y, Zr, La, Ce, or Nd).

Note that when the oxide semiconductor film 108 includes In-M-Zn oxide, the proportion of In and the proportion of M, not taking Zn and O into consideration, are preferably greater than or equal to 25 atomic % and less than 75 atomic %, respectively, more preferably greater than or equal to 34 atomic % and less than 66 atomic %, respectively.

The energy gap of the oxide semiconductor film 108 is 2 eV or more, preferably 2.5 eV or more, more preferably 3 eV or more. With the use of an oxide semiconductor having such a wide energy gap, the off-state current of the transistor 100 can be reduced.

The thickness of the oxide semiconductor film 108 is greater than or equal to 3 nm and less than or equal to 200 nm, preferably greater than or equal to 3 nm and less than or equal to 100 nm, more preferably greater than or equal to 3 nm and less than or equal to 50 nm.

In the case where the oxide semiconductor film 108 includes In-M-Zn oxide (M represents Al, Ga, Y, Zr, La, Ce, or Nd), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratios of metal elements in the formed oxide semiconductor film 108 vary from the above atomic ratio of metal elements of the sputtering target within a range of ±40% as an error.

An oxide semiconductor film with low carrier density is used as the oxide semiconductor film 108. For example, an oxide semiconductor film whose carrier density is $1\times10^{17}/\text{cm}^3$ or lower, preferably $1\times10^{15}/\text{cm}^3$ or lower, more preferably $1\times10^{13}/\text{cm}^3$ or lower, still more preferably $1\times10^{11}/\text{cm}^3$ or lower is used as the oxide semiconductor film 108.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

Note that it is preferable to use, as the oxide semiconductor film 108, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that hydrogen be reduced as much as possible as well as the oxygen vacancies in the oxide semiconductor film 108. Specifically, the hydrogen concentration of the oxide semiconductor film 108, which is measured by secondary ion mass spectrometry (SIMS), is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, even more preferably lower than $5\times10^{18}$ atoms/cm$^3$, still more preferably lower than or equal to $1\times10^{18}$ atoms/cm$^3$, yet still more preferably lower than or equal to $5\times10^{17}$ atoms/cm$^3$, even further more preferably lower than or equal to $1\times10^{16}$ atoms/cm$^3$.

When silicon or carbon that is one of elements belonging to Group 14 is contained in the oxide semiconductor film 108, oxygen vacancies are increased in the oxide semiconductor film 108, and the oxide semiconductor film 108 becomes an n-type film. Thus, the concentration of silicon or carbon (the concentration is measured by SIMS) of the oxide semiconductor film 108 is lower than or equal to $2\times10^{18}$ atoms/cm$^3$, preferably lower than or equal to $2\times10^{17}$ atoms/cm$^3$.

Further, the concentration of alkali metal or alkaline earth metal of the oxide semiconductor film 108, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108.

Further, when containing nitrogen, the oxide semiconductor film 108 easily becomes n-type by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably set to, for example, lower than or equal to $5\times10^{18}$ atoms/cm$^3$.

The oxide semiconductor film 108 may have a non-single-crystal structure, for example. The non-single-crystal structure includes a c-axis aligned crystalline oxide semiconductor (CAAC-OS) that is described later, a polycrystalline structure, a microcrystalline structure described later, or an amorphous structure, for example. Among the non-single-crystal structure, the amorphous structure has the highest density of defect levels, whereas CAAC-OS has the lowest density of defect levels.

The oxide semiconductor film 108 may have an amorphous structure, for example. An oxide semiconductor film having an amorphous structure has, for example, disordered atomic arrangement and no crystalline component. Alternatively, an oxide film having an amorphous structure has, for example, an absolutely amorphous structure and has no crystal part.

Note that the oxide semiconductor film 108 may be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a layered structure of two or more of a region having an amorphous structure, a region having a microcrystalline structure, a region having a polycrystalline structure, a CAAC-OS region, and a region having a single-crystal structure in some cases.

The pair of electrodes 110 and 112 are formed with a single-layer structure or a layered structure using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is formed over a copper-magnesium-aluminum alloy film, a two-layer structure in which a copper film is formed over a titanium film, a two-layer structure in which a copper film is formed over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

It is preferable that the oxide insulating film 114 serving as a protective film of the transistor 100 and serving as a second gate insulating film include the oxide insulating film 114 containing more oxygen than that in the stoichiometric composition. Here, the oxide insulating film 114 is provided in contact with the oxide semiconductor film 108. It is further preferable that the oxide insulating film 114 has a layered structure including a first oxide insulating film through which oxygen passes and a second oxide insulating film containing more oxygen than that in the stoichiometric composition. The nitride insulating film 116 has a function of blocking the entrance of hydrogen and oxygen.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 114. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the first oxide insulating film which can be used for the oxide insulating film 114 be small and typically, the spin density of a signal that appears at g=2.001 due to a dangling bond of silicon be lower than or equal to $3 \times 10^{17}$ spins/cm$^3$ by ESR measurement. This is because if the density of defects in the first oxide insulating film which can be used for the oxide insulating film 114 is high, oxygen is bonded to the defects and the amount of oxygen that passes through the first oxide insulating film is reduced.

Further, it is preferable that the amount of defects at the interface between the oxide semiconductor film 108 and the first oxide insulating film which can be used for the oxide insulating film 114 be small and typically, the spin density of a signal that appears at g=1.93 due to an oxygen vacancy in the oxide semiconductor film 108 be lower than or equal to $1 \times 10^{17}$ spins/cm$^3$, more preferably lower than or equal to the lower limit of detection by ESR measurement.

Note that in the first oxide insulating film which can be used for the oxide insulating film 114, all oxygen that enters the first oxide insulating film from the outside is transferred to the outside of the first oxide insulating film in some cases. Alternatively, some oxygen that enters the first oxide insulating film from the outside remains in the first oxide insulating film. Further, movement of oxygen occurs in the first oxide insulating film in some cases in such a manner that oxygen enters the first oxide insulating film from the outside and oxygen contained in the first oxide insulating film is transferred to the outside of the first oxide insulating film.

The second oxide insulating film is preferably formed in contact with the above-described first oxide insulating film. The second oxide insulating film is formed using an oxide insulating film that contains a higher proportion of oxygen than that of oxygen in the stoichiometric composition. Part of oxygen is released by heating from the oxide insulating film that contains a higher proportion of oxygen than that of oxygen in the stoichiometric composition. The oxide insulating film containing a higher proportion of oxygen than that of oxygen in the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$, in TDS analysis performed at surface temperatures comprised between 100° C. and 700° C. or between 100° C. and 500° C.

A silicon oxide film, a silicon oxynitride film, or the like with a thickness greater than or equal to 30 nm and less than or equal to 500 nm, or greater than or equal to 50 nm and less than or equal to 400 nm can be used for the second oxide insulating film which can be used for the oxide insulating film 114.

Further, it is preferable that the amount of defects in the above-described second oxide insulating film be small and typically, the spin density of a signal that appears at g=2.001 originating from a dangling bond of silicon be lower than $1.5 \times 10^{18}$ spins/cm$^3$, more preferably lower than or equal to $1 \times 10^{18}$ spins/cm$^3$ by ESR measurement. Note that the second oxide insulating film is provided more apart from the oxide semiconductor film 108 than the first oxide insulating film is; thus, the second oxide insulating film may have higher defect density than the first oxide insulating film.

The nitride insulating film 116 has an effect of blocking at least hydrogen and oxygen. Preferably, the nitride insulating film 116 has an effect of blocking oxygen, hydrogen, water, an alkali metal, an alkaline earth metal, or the like. It is possible to prevent outward diffusion of oxygen from the oxide semiconductor film 108 and entry of hydrogen, water, or the like into the oxide semiconductor film 108 from the outside by providing the nitride insulating film 116 over the oxide insulating film 114.

The nitride insulating film 116 is formed using a silicon nitride film, a silicon nitride oxide film, an aluminum nitride film, an aluminum nitride oxide film, or the like having a thickness of greater than or equal to 50 nm and less than or equal to 300 nm, preferably greater than or equal to 100 nm and less than or equal to 200 nm.

Note that instead of the nitride insulating film 116, an oxide insulating film having a blocking effect against oxygen, hydrogen, water, and the like may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

A conductive film having a reflective property can be used for the gate electrode 120 and the conductive film 122, for example. For example, the conductive film having a reflective property can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of any of these metals; and a nitride of any of these metals. Note that the conductive film which can be used for the gate electrode 120 and the conductive film 122 is not limited thereto. For example, a conductive film having a light-transmitting property can be used. The conductive film having a light-transmitting property can be formed using indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, or the like.

When the gate electrode 120 and the conductive film 122 are formed using a reflective conductive film, the conductive film 122 serving as a pixel electrode can serve as a reflective pixel electrode. Such a structure is preferable in the case where a light-emitting device having a top-emission structure is formed, for example. When the gate electrode 120 and the conductive film 122 are formed using a light-transmitting conductive film, the conductive film 122 serving as a pixel electrode can serve as a light-transmitting pixel electrode. Such a structure is preferable in the case where a light-emitting device having a bottom-emission structure is formed, for example.

The reflective conductive film and the light-transmitting conductive film which are described above may be stacked so that the gate electrode 120 and the conductive film 122 have a semi-transmissive and semi-reflective property. In this case, the above-described reflective conductive film is preferably formed thin enough to have a light-transmitting property. Such a structure is preferable in the case where a light-emitting device having a dual-emission structure is formed, for example.

Next, a method for manufacturing the transistor 100 illustrated in FIGS. 1A to 1C is described with reference to FIGS. 2A to 2H. Note that manufacturing steps of cross section in a channel length direction of the transistor 100 in FIG. 1B are shown in FIGS. 2A, 2C, 2E, and 2G, and manufacturing steps of cross section in a channel width direction of the transistor 100 in FIG. 1C are shown in FIGS. 2B, 2D, 2F, and 2H.

Figure 2A:
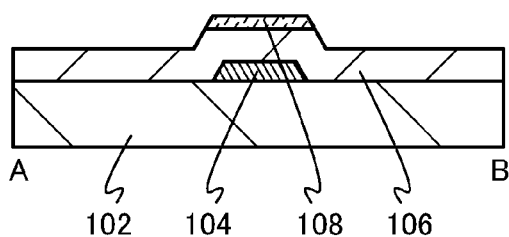
FIGS. 2A to 2H are cross-sectional views illustrating one embodiment of a method for manufacturing a transistor.
Figure 2B:
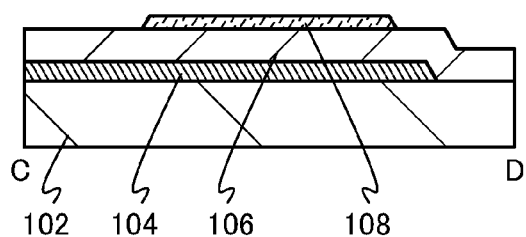

As shown in FIGS. 2A and 2B, the gate electrode 104 is formed over the substrate 102, and the gate insulating film 106 is formed over the gate electrode 104. Next, the oxide semiconductor film 108 is formed over the gate insulating film 106.

In this case, a glass substrate is used as the substrate 102.

A formation method of the gate electrode 104 is described below. First, a conductive film is formed by a sputtering method, a CVD method, an evaporation method, or the like and then a mask is formed over the conductive film by a photolithography process using a first photomask. Next, a part of the conductive film is etched with the use of the mask to form the gate electrode 104. After that, the mask is removed.

Note that the gate electrode 104 may be formed by an electrolytic plating method, a printing method, an inkjet method, or the like instead of the above formation method.

Here, a 100-nm-thick tungsten film is formed by a sputtering method. Then, a mask is formed by a photolithography process and the tungsten film is dry-etched using the mask to form the gate electrode 104.

The gate insulating film 106 is formed by a sputtering method, a CVD method, an evaporation method, or the like.

In the case where a silicon oxide film, a silicon oxynitride film, or a silicon nitride oxide film is formed as the gate insulating film 106, a deposition gas containing silicon and an oxidizing gas are preferred to be used as source gases. Typical examples of the deposition gas containing silicon include silane, disilane, trisilane, and silane fluoride. As the oxidizing gas, oxygen, ozone, dinitrogen monoxide, and nitrogen dioxide can be given as examples.

In the case where a gallium oxide film is formed as the gate insulating film 106, metal organic chemical vapor deposition (MOCVD) can be used.

A formation method of the oxide semiconductor film 108 is described below. An oxide semiconductor film which is to be the oxide semiconductor film 108 is formed over the gate insulating film 106. Then, after a mask is formed over the oxide semiconductor film by a photolithography process using a second photomask, the oxide semiconductor film is partly etched using the mask. Thus, the oxide semiconductor film 108 subjected to element isolation as illustrated in FIGS. 2A and 2B is formed. After that, the mask is removed.

The oxide semiconductor film which is to be the oxide semiconductor film 108 can be formed by a sputtering method, a coating method, a pulsed laser deposition method, a laser ablation method, or the like.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon) atmosphere, an oxidizing atmosphere, or a mixed gas of a rare gas and oxygen is used as appropriate. In the case of using the mixed gas of a rare gas and oxygen, the proportion of oxygen to a rare gas is preferably increased.

A sputtering target may be appropriately selected in accordance with the composition of the oxide semiconductor film to be formed.

In order to obtain a highly purified intrinsic or substantially highly purified intrinsic oxide semiconductor film, it is necessary to highly purify a sputtering gas as well as to evacuate the chamber to a high vacuum. As an oxygen gas or an argon gas used for a sputtering gas, a gas which is highly purified to have a dew point of $-40°$ C. or lower, preferably $-80°$ C. or lower, more preferably $-100°$ C. or lower, still more preferably $-120°$ C. or lower is used, whereby entry of moisture or the like into the oxide semiconductor film can be prevented as much as possible.

Here, a 35-nm-thick In—Ga—Zn oxide film is formed as the oxide semiconductor film by a sputtering method using an In—Ga—Zn oxide target (In:Ga:Zn=3:1:2). Next, a mask is formed over the oxide semiconductor film, and part of the oxide semiconductor film is selectively etched. Thus, the oxide semiconductor film 108 is formed.

Figure 2C:
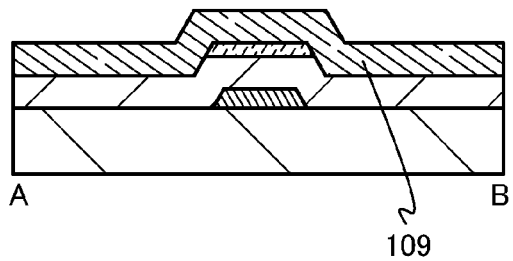
Figure 2D:
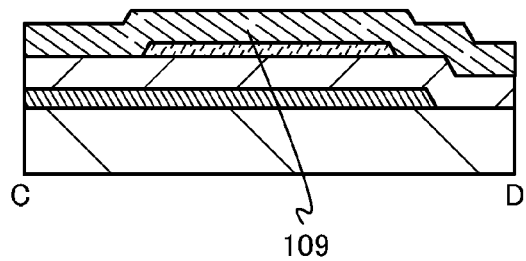

Next, as shown in FIGS. 2C and 2D, a conductive film 109 is formed over the gate insulating film 106 and the oxide semiconductor film 108.

The conductive film 109 is formed by a sputtering method, a CVD method, an evaporation method, or the like. Here, as the conductive film 109, a 50-nm-thick tungsten film and a 300-nm-thick copper film are stacked in this order by a sputtering method.

Figure 2E:
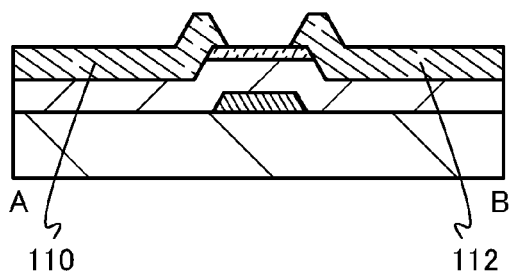
Figure 2F:
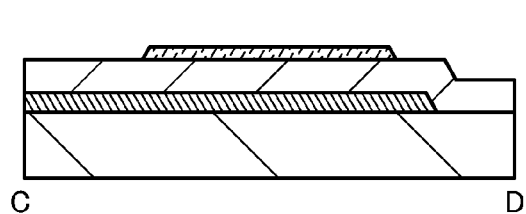

Next, as illustrated in FIGS. 2E and 2F, the pair of electrodes 110 and 112 is formed.

A formation method of the pair of electrodes 110 and 112 is as follows: a photolithography process using a third photomask is performed to form a mask over the conductive film 109; then, the conductive film 109 is etched using the mask to form the pair of electrodes 110 and 112; and then, the mask is removed.

Here, a mask is formed over a copper film by a photolithography process. Then, the tungsten film and the copper film are subjected to dry etching using the mask to form the pair of electrodes 110 and 112. Note that the copper film is etched by a wet etching method. Subsequently, the tungsten film is etched by a dry etching method using $SF_6$, so that a fluoride is formed on a surface of the copper film. The fluoride can reduce diffusion of copper elements from the copper film, resulting in a reduction in the copper concentration in the oxide semiconductor film 108.

Figure 2G:
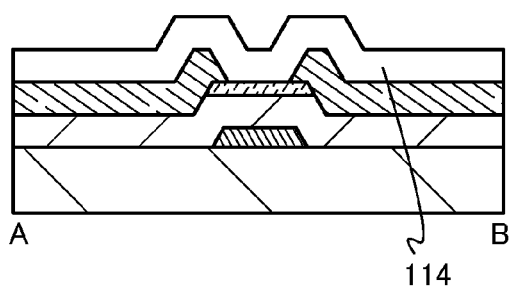
Figure 2H:
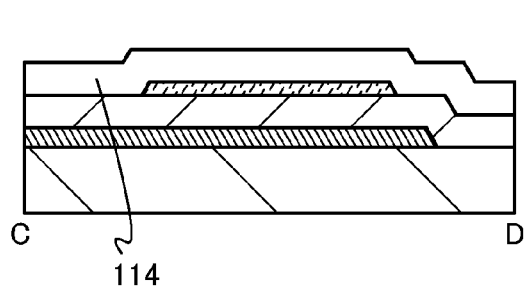

Next, as shown in FIGS. 2G and 2H, the oxide insulating film 114 is formed over the gate insulating film 106, the oxide semiconductor film 108, and the pair of electrodes 110 and 112.

A formation method of the oxide insulating film 114 is described below.

Here, the oxide insulating film 114 has a layered structure of the first oxide insulating film and the second oxide insulating film.

As the first oxide insulating film, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber. As a source gas of the first oxide insulating film, a deposition gas containing silicon and an oxidizing gas is preferably used. Typical examples of the deposition gas containing silicon include silane, disilane, trisilane, and silane fluoride. As the oxidizing gas, oxygen, ozone, dinitrogen monoxide, and nitrogen dioxide can be given as examples.

With the use of the above conditions, an oxide insulating film through which oxygen passes can be formed as the first oxide insulating film. Further, by providing the first oxide insulating film, damage to the oxide semiconductor film 108 can be reduced in a step of forming the second oxide insulating film which is formed later.

Note that as the first oxide insulating film, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 100 Pa and less than or equal to 250 Pa with introduction of a source gas into the treatment chamber, and a high-frequency power is supplied to an electrode provided in the treatment chamber.

In the above film formation conditions, when the substrate temperature is set to the above-described temperature, the bonding strength of silicon and oxygen becomes high. Consequently, as the first oxide insulating film, a dense and hard oxide insulating film which is permeable to oxygen, typically, a silicon oxide film or a silicon oxynitride film having an etching rate lower than or equal to 10 nm/min, preferably lower than or equal to 8 nm/min when etching is performed at 25° C. with 0.5 weight % using hydrofluoric acid can be formed.

The first oxide insulating film is formed while heating is performed; thus, hydrogen, water, or the like contained in the oxide semiconductor film 108 can be released in the step. Hydrogen contained in the oxide semiconductor film 108 is bonded to an oxygen radical formed in plasma to form water. Since the substrate is heated in the step of forming the first oxide insulating film, water formed by bonding of oxygen and hydrogen is released from the oxide semiconductor film 108. That is, when the first oxide insulating film is formed by a plasma CVD method, the amount of water and hydrogen contained in the oxide semiconductor film 108 can be reduced.

Further, time for heating in a state where the oxide semiconductor film 108 is exposed can be shortened because heating is performed in a step of forming the first oxide insulating film. Thus, the amount of oxygen released from the oxide semiconductor film by heat treatment can be reduced. That is, the amount of oxygen vacancies in the oxide semiconductor film can be reduced.

The pressure in the treatment chamber is set to be higher than or equal to 100 Pa and lower than or equal to 250 Pa, whereby the amount of water contained in the first oxide insulating film is reduced; thus, variations of electrical characteristics of the transistor 100 can be reduced and the change in threshold voltage can be suppressed.

Further, by setting the pressure in the treatment chamber to be greater than or equal to 100 Pa and less than or equal to 250 Pa, damage to the oxide semiconductor film 108 can be reduced when the first oxide insulating film is formed, so that the amount of oxygen vacancies contained in the oxide semiconductor film 108 can be reduced. In particular, when the film formation temperature of the first oxide insulating film or the second oxide insulating film which is formed later is set to be high, typically higher than 220° C., part of oxygen contained in the oxide semiconductor film 108 is released and oxygen vacancies are easily formed. Further, when the film formation conditions for reducing the number of defects in the second oxide insulating film which is formed later are used to increase reliability of the transistor, the amount of released oxygen is easily reduced. Thus, it is difficult to fill oxygen vacancies in the oxide semiconductor film 108 in some cases. However, by setting the pressure in the treatment chamber to be greater than or equal to 100 Pa and less than or equal to 250 Pa to reduce damage to the oxide semiconductor film 108 at the time of forming the first oxide insulating film, oxygen vacancies in the oxide semiconductor film 108 can be reduced even when the amount of oxygen released from the first oxide insulating film is small.

Note that when the ratio of the amount of the oxidizing gas to the amount of the deposition gas containing silicon is 100 or higher, the hydrogen content in the first oxide insulating film can be reduced. Consequently, the amount of hydrogen entering the oxide semiconductor film 108 can be reduced; thus, the negative shift in the threshold voltage of the transistor can be inhibited.

Here, as the first oxide insulating film, a 50-nm-thick silicon oxynitride film is formed by a plasma CVD method in which silane with a flow rate of 30 sccm and dinitrogen monoxide with a flow rate of 4000 sccm are used as source gases, the pressure in the treatment chamber is 200 Pa, the substrate temperature is 220° C., and a high-frequency power of 150 W is supplied to parallel plate electrodes with the use of a 27.12 MHz high-frequency power source. Under the above conditions, a silicon oxynitride film through which oxygen is permeable can be formed.

Next, the second oxide insulating film is formed over the first oxide insulating film. Note that after the first oxide insulating film is formed, the second oxide insulating film is preferably formed in succession without exposure to the air. After the first oxide insulating film is formed, the second oxide insulating film is formed in succession by adjusting at least one of the flow rate of a source gas, pressure, a high-frequency power, and a substrate temperature without exposure to the air, whereby the concentration of impurities attributed to the atmospheric component at the interface between the first oxide insulating film and the second oxide insulating film can be reduced and oxygen in the second oxide insulating film can be moved to the oxide semiconductor film 108; accordingly, the number of oxygen vacancies in the oxide semiconductor film 108 can be reduced.

For example, the second oxide insulating film is formed under the conditions as follows: the substrate placed in a treatment chamber of a plasma CVD apparatus, which is vacuum-evacuated, is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

A deposition gas containing silicon and an oxidizing gas are preferably used as the source gas of the second oxide insulating film. Typical examples of the deposition gas containing silicon include silane, disilane, trisilane, and silane fluoride. As the oxidizing gas, oxygen, ozone, dinitrogen monoxide, and nitrogen dioxide can be given as examples.

As the film formation conditions of the second oxide insulating film, the high-frequency power having the above power density is supplied to a reaction chamber having the above pressure, whereby the decomposition efficiency of the source gas in plasma is increased, oxygen radicals are increased, and oxidation of the source gas is promoted; therefore, the oxygen content of the second oxide insulating film becomes higher than in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating. Furthermore, the first oxide insulating film is provided over the oxide semiconductor film 108. Accordingly, in the step of forming the second oxide insulating film, the first oxide insulating film serves as a protective film of the oxide semiconductor film 108. Consequently, the second oxide insulating film can be formed using the high-frequency power having a high power density while damage to the oxide semiconductor film 108 is reduced.

Here, as the second oxide insulating film, a 400-nm-thick silicon oxynitride film is formed by a plasma CVD method under the following conditions: silane with a flow rate of 200 sccm and dinitrogen monoxide with a flow rate of 4000 sccm are used as the source gas, the pressure in the reaction chamber is 200 Pa, the substrate temperature is 220° C., and the high-frequency power of 1500 W is supplied to parallel plate electrodes with the use of a 27.12 MHz high-frequency power source. Note that the plasma CVD apparatus is a parallel plate plasma CVD apparatus in which the electrode area is 6000 cm$^2$, and the power per unit area (power density) into which the supplied power is converted is 0.25 W/cm$^2$.

Next, heat treatment is performed. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 114 can be moved to the oxide semiconductor film 108 to compensate the oxygen vacancies in the oxide semiconductor film 108. Consequently, the amount of oxygen vacancies in the oxide semiconductor film 108 can be further reduced.

In the case where water, hydrogen, or the like is contained in the oxide insulating film 114, when the nitride insulating film 116 having a function of blocking water, hydrogen, and the like is formed later and heat treatment is performed, water, hydrogen, or the like contained in the oxide insulating film 114 are moved to the oxide semiconductor film 108, so that defects are generated in the oxide semiconductor film 108. However, by the heating, water, hydrogen, or the like contained in the oxide insulating film 114 can be released; thus, variation in electrical characteristics of the transistor 100 can be reduced, and change in threshold voltage can be inhibited.

Here, the heat treatment is performed at 350° C. under a mixed atmosphere of nitrogen and oxygen for one hour.

When the pair of electrodes 110 and 112 is formed, the oxide semiconductor film 108 is damaged by the etching of the conductive film, so that oxygen vacancies are generated on the back channel side (the side of the oxide semiconductor film 108 which is opposite to the side facing the gate electrode 104) of the oxide semiconductor film 108. However, with the use of the oxide insulating film containing more oxygen than that in the stoichiometric composition as the oxide insulating film 114, the oxygen vacancies generated on the back channel side can be repaired by heat treatment. By this, defects contained in the oxide semiconductor film 108 can be reduced, and thus, the reliability of the transistor 100 can be improved.

Figure 3A:
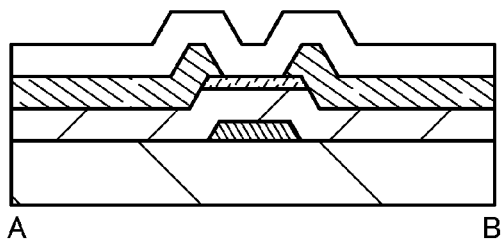
FIGS. 3A to 3H are cross-sectional views illustrating one embodiment of a method for manufacturing a transistor.
Figure 3B:
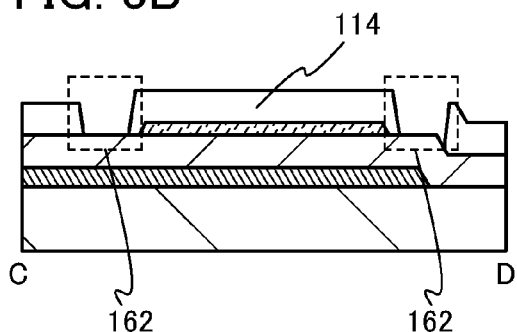

Next, as shown in FIGS. 3A and 3B, openings 162 reaching the gate insulating film 106 are formed in the oxide insulating film 114. A formation method of the openings 162 is described below.

In the formation method of the openings 162, a photolithography process using a fourth mask is performed to form a mask over the oxide insulating film 114, and the oxide insulating film 114 is etched using the mask. Thus, the openings 162 are formed. After that, the mask is removed. Here, a dry etching method is used to form the openings 162.

Note that when the openings 162 are formed, the thickness of a part of the gate insulating film 106 might be reduced, in which case the gate insulating film 106 has unevenness.

As shown in FIG. 3B, the oxide insulating film 114 is etched so that the end portion of the oxide insulating film 114 serving as a second gate insulating film is positioned beyond a side of the oxide semiconductor film 108 in the channel width direction. Thus, the oxide insulating film 114 having the openings 162 can be formed.

Figure 3C:
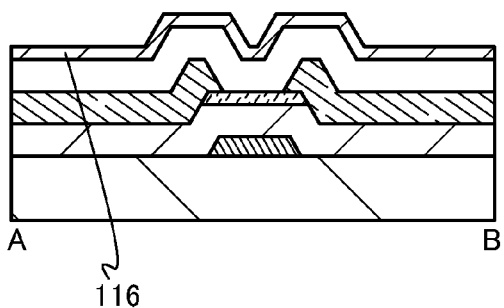
Figure 3D:
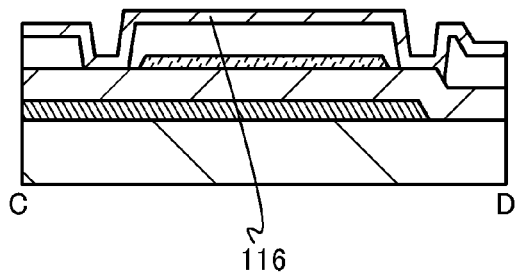

Next, as shown in FIGS. 3C and 3D, the nitride insulating film 116 is formed over the oxide insulating film 114 to cover the openings 162. A formation method of the nitride insulating film 116 is described below.

The nitride insulating film 116 can be formed by a sputtering method or a CVD method, for example.

Note that in the case where the nitride insulating film 116 is formed by a plasma CVD method, the substrate placed in the treatment chamber of the plasma CVD apparatus that is vacuum-evacuated is preferably set to be higher than or equal to 300° C. and lower than or equal to 400° C., more preferably, higher than or equal to 320° C. and lower than or equal to 370° C., so that a dense nitride insulating film can be formed.

In the case where a silicon nitride film is formed by the plasma CVD method as the nitride insulating film 116, a deposition gas containing silicon, nitrogen, and ammonia are preferably used as a source gas. As the source gas, ammonia whose amount is smaller than the amount of nitrogen is used, whereby ammonia is dissociated in the plasma and activated species are generated. The activated species cut a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in a source gas, decomposition of a deposition gas containing silicon and decomposition of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, more preferably greater than or equal to 10 and less than or equal to 50.

Here, in the treatment chamber of a plasma CVD apparatus, a 50-nm-thick silicon nitride film is formed by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Thus, a 50-nm-thick silicon nitride film is formed as the nitride insulating film 116. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

Next, heat treatment may be performed. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C.

Note that, as shown in FIG. 3D, the nitride insulating film 116 is formed to cover a side surface of the etched oxide insulating film 114.

Figure 3E:
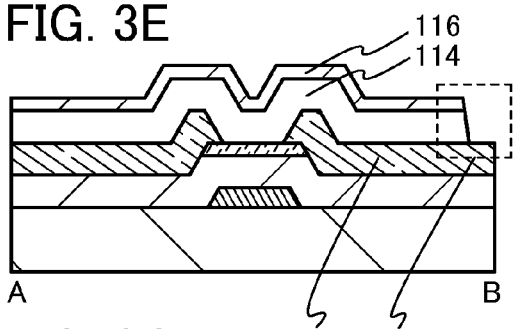
Figure 3F:
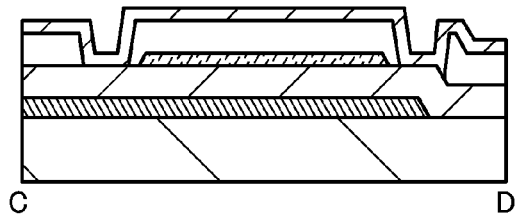

Next, as shown in FIGS. 3E and 3F, an opening 164 reaching the electrode 112 is formed in the oxide insulating film 114 and the nitride insulating film 116. A formation method of the opening 164 is described below.

In the formation method of the opening 164, a photolithography process using a fifth mask is performed to form a mask over the nitride insulating film 116, and the oxide insulating film 114 and the nitride insulating film 116 are etched using the mask. Thus, the opening 164 is formed. After that, the mask is removed. Here, a dry etching method is used to form the opening 164.

Note that as shown in FIG. 3E, the oxide insulating film 114 and the nitride insulating film 116 serving as a second gate insulating film are etched so that end portions of the oxide insulating film 114 and the nitride insulating film 116 are positioned over the electrode 112 in a channel length direction.

Figure 3G:
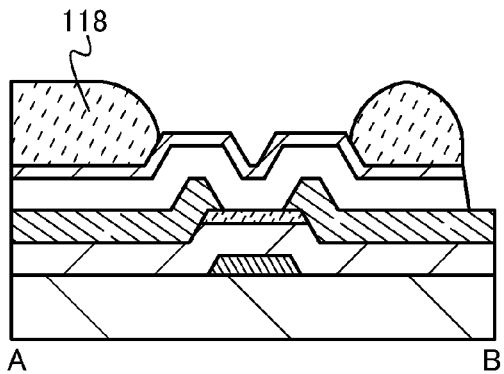
Figure 3H:
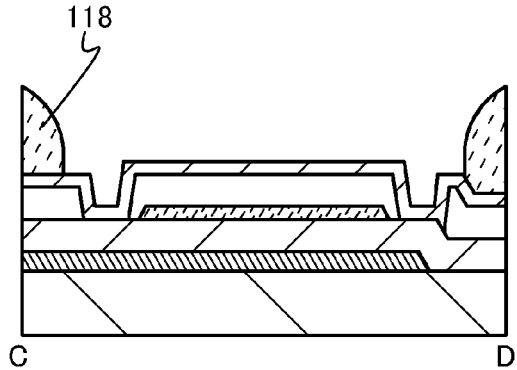

Next, as shown in FIGS. 3G and 3H, the insulating film 118 having openings is formed. A formation method of the insulating film 118 is described below.

The insulating film 118 can be formed using an organic insulating film, for example. The organic insulating film can be formed using an organic material such as a polyimide-based resin, a polyamide-based resin, an acrylic-based resin, a siloxane-based resin, an epoxy-based resin, or a phenol-based resin. Note that the insulating film 118 serves as a planarization film.

Here, as the insulating film 118, a positive acrylic-based resin is applied using a spin coater apparatus so that unevennesses formed over the nitride insulating film 116 and the opening 164 are filled with the positive acrylic-based resin. Then, selected regions of the acrylic-based resin are irradiated with light using a sixth photomask to form the openings. After that, the acrylic-based resin is baked using a hot plate at 200° C. In this manner, the insulating film 118 having the openings can be formed.

The insulating film 118 has at least a first opening and a second opening. The first opening is formed so that a region of the nitride insulating film 116 which overlaps the oxide semiconductor film 108 is exposed. The second opening is formed so that the opening 164 is exposed.

Figure 4A:
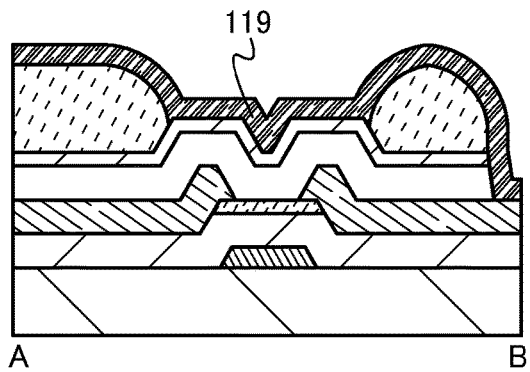
FIGS. 4A to 4F are cross-sectional views illustrating one embodiment of a method for manufacturing a transistor.
Figure 4B:
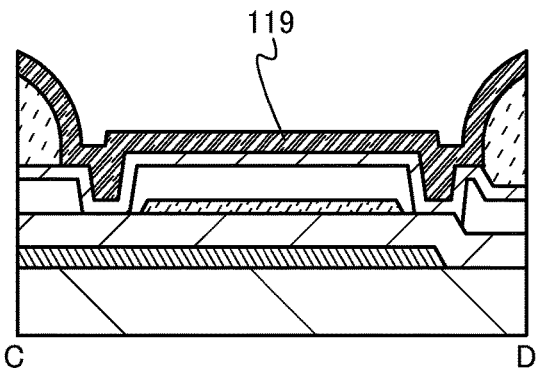

Next, as shown in FIGS. 4A and 4B, a conductive film 119 is formed. A method for forming the conductive film 119 is described below.

The conductive film 119 can be formed by a sputtering method, a CVD method, an evaporation method, or the like. Here, as the conductive film 119, a 200-nm-thick aluminum film is used.

Figure 4C:
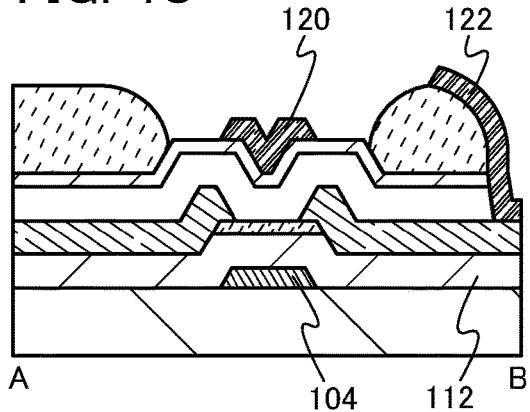
Figure 4D:
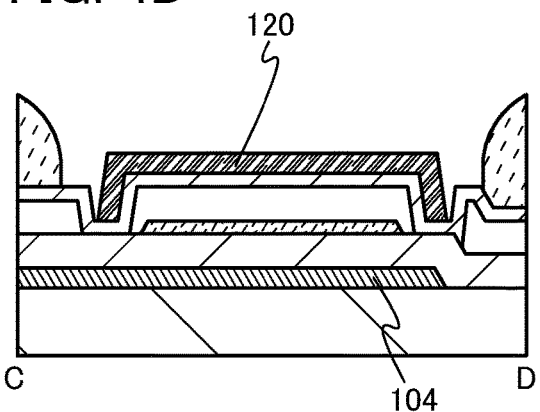

Next, as shown in FIGS. 4C and 4D, the gate electrode 120 and the conductive film 122 are formed by processing the conductive film 119. A formation method of the gate electrode 120 and the conductive film 122 is described below.

By a photolithography process using a seventh photomask, a mask is formed over the conductive film 119. Then, a part of the conductive film 119 is etched using the mask to form the gate electrode 120 and the conductive film 122. After that, the mask is removed.

As shown in FIG. 4C, the gate electrode 120 is formed so that an end portion of the gate electrode 120 is positioned over the nitride insulating film 116 in a channel length direction. Here, the end portion of the gate electrode 120 substantially overlaps the end portion of the gate electrode 104. Note that a fabricated transistor might be different from the transistor in a design stage depending on variation occurring in a manufacturing process of the transistor. Thus, even when the transistor is designed so that the end portion of the gate electrode 120 overlaps the end portion of the gate electrode 104, there is a possibility that the end portions are not aligned and are shifted from each other by approximately 5 µm. For this reason, the term "substantially overlap" also refers to the case where the amount of the shift of the end portion of the gate electrode 104 from the end portion of the gate electrode 120 is approximately within ±5 µm.

As shown in FIG. 4C, the conductive film 122 is formed in contact with the electrode 112.

As shown in FIG. 4D, the gate electrode 120 is formed to face the side surface of the oxide semiconductor film 108, with the side surfaces of the oxide insulating film 114 and the nitride insulating film 116 serving as a second gate insulating film provided therebetween in the channel width direction. That is, the gate electrode 120 is formed so that its end portion is positioned on beyond the end portion of the oxide semiconductor film 108 in the channel width direction.

Figure 4E:
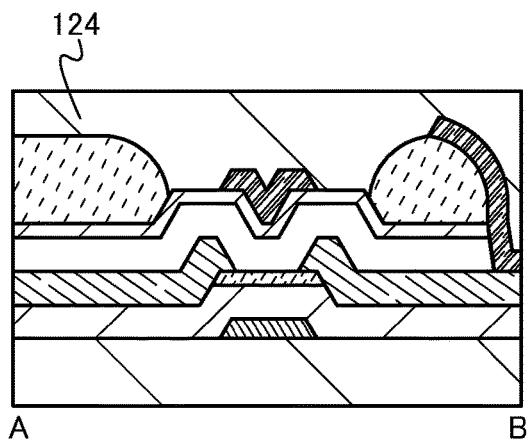
Figure 4F:
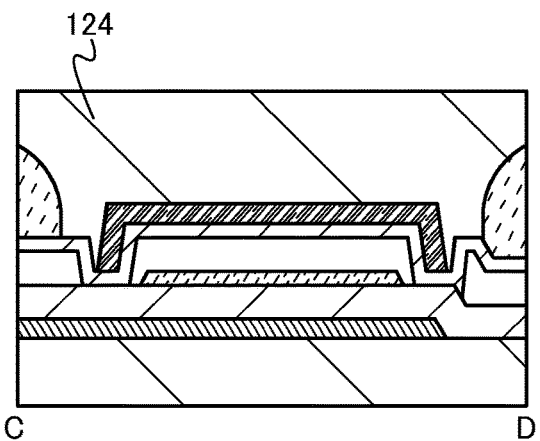

Next, the insulating film 124 is formed as illustrated in FIGS. 4E and 4F. A formation method of the insulating film 124 is described below.

The insulating film 124 can be formed using an organic insulating film, for example. The organic insulating film can be formed using an organic material such as a polyimide-based resin, a polyamide-based resin, an acrylic-based resin, a siloxane-based resin, an epoxy-based resin, or a phenol-based resin. Note that the insulating film 124 serves as a partition wall for isolation between light-emitting elements formed over the semiconductor device of one embodiment of the present invention.

Here, as the insulating film 124, a positive polyimide-based resin is applied using a spin coater apparatus. Then, a desired region of the acrylic-based resin is irradiated with light using an eighth photomask to form an opening (not shown). After that, the polyimide-based resin is baked using a hot plate at 250° C. In this manner, the insulating film 124 can be formed.

Through the above steps, the transistor 100 can be manufactured.

Modification Example

Next, a modification example of the semiconductor device shown in FIGS. 1A to 1C, which is one embodiment of the present invention, is described below with reference to FIGS. 5A to 5C.

Figure 5A:
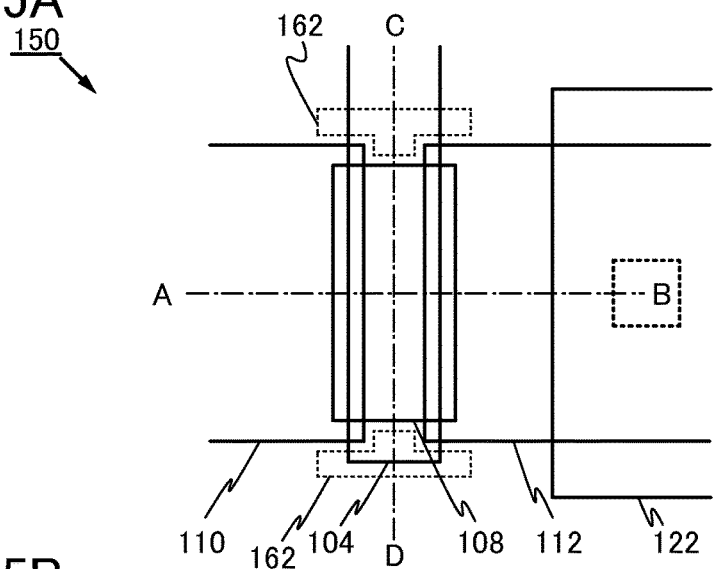
FIGS. 5A to 5C are a top view and cross-sectional views illustrating one embodiment of a transistor.
Figure 5B:
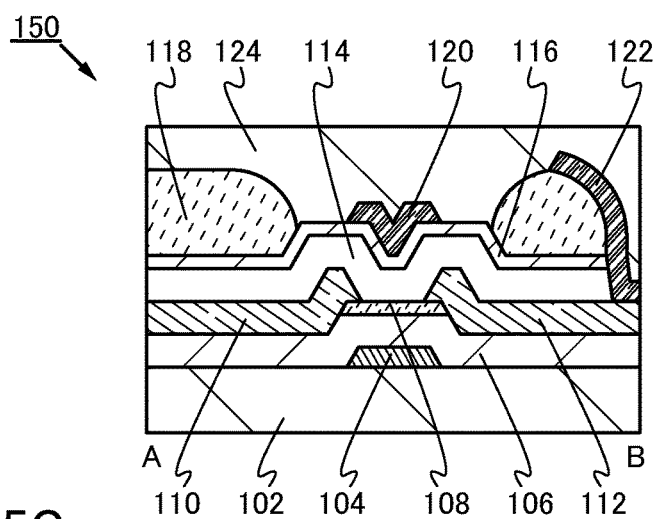
Figure 5C:
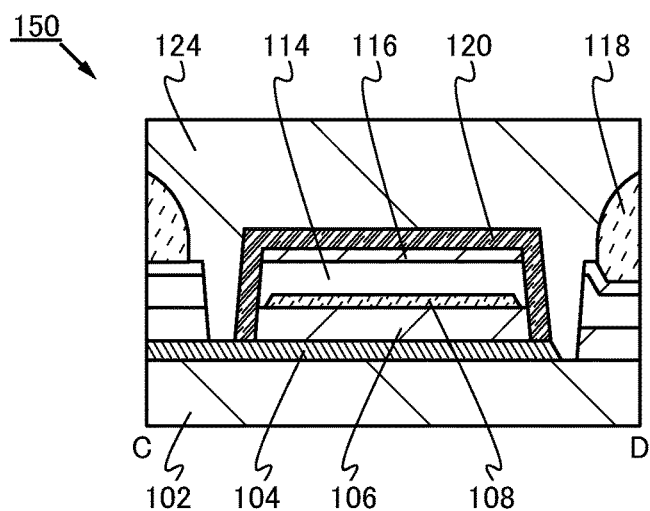

FIGS. 5A to 5C are a top view and cross-sectional views of a transistor 150 included in a semiconductor device. The transistor 150 shown in FIGS. 5A to 5C is a channel-etched transistor. FIG. 5A is a top view of the transistor 150, FIG. 5B is a cross-sectional view taken along dashed-dotted line A-B in FIG. 5A, and FIG. 5C is a cross-sectional view taken along dashed-dotted line C-D in FIG. 5A. Note that in FIG. 5A, a substrate 102, a gate insulating film 106, and the like are omitted for simplicity.

The transistor 150 illustrated in FIGS. 5B and 5C includes a gate electrode 104 provided over the substrate 102. Moreover, the gate insulating film 106 over the substrate 102 and the gate electrode 104, an oxide semiconductor film 108 overlapping the gate electrode 104 with the gate insulating film 106 provided therebetween, and a pair of electrodes 110 and 112 which are in contact with the oxide semiconductor film 108 are included. An oxide insulating film 114 and a nitride insulating film 116 are formed over the gate insulating film 106, the oxide semiconductor film 108, and the pair of electrodes 110 and 112. The oxide insulating film 114 and the nitride insulating film 116 serve as a protective film of the transistor 150 and also serve as a second gate insulating film of the transistor 150.

A gate electrode 120 is formed over the oxide insulating film 114 and the nitride insulating film 116 serving as a second gate insulating film. An insulating film 118 having an opening is formed in contact with the nitride insulating film 116. The insulating film 118 is formed so that the oxide semiconductor film 108 is positioned in a region overlapping with the opening. Openings are provided in the insulating film 118, and the oxide insulating film 114 and the nitride insulating film 116 serving as a second gate insulating film; one of the openings reaches the electrode 112. A conductive film 122 is connected to one of the pair of electrodes 110 and 112 (in this structure, connected to the electrode 112). The conductive film 122 is formed to cover the insulating film 118. Note that the conductive film 122 serves as a pixel electrode.

Note that the gate electrode 120 is provided to be in contact with the nitride insulating film 116 serving as a second gate insulating film and to overlap the oxide semiconductor film 108 in a region overlapping with another opening provided in the insulating film 118. The gate electrode 120 and the conductive film 122 are formed in the same step; that is, the gate electrode 120 and the conductive film 122 are formed using the same material.

An insulating film 124 is formed over the nitride insulating film 116, the insulating film 118, the gate electrode 120, and the conductive film 122. Note that the insulating film 124 serves as a partition wall for isolation between light-emitting elements formed over the semiconductor device of one embodiment of the present invention.

In the transistor 150 of this embodiment, the oxide semiconductor film 108 is provided between the gate electrode 104 and the gate electrode 120. In the oxide insulating film 114 and the nitride insulating film 116 serving as a second gate insulating film, openings are provided in the channel width direction of the transistor 150 shown in FIG. 5C, and the oxide semiconductor film 108 is provided between the openings. In the channel width direction of the transistor 150 shown in FIG. 5C, the end portions of the oxide insulating film 114 and the nitride insulating film 116 are positioned beyond the oxide semiconductor film 108. In the channel width direction of the transistor 150 shown in FIG. 5C, the gate electrode 120 faces a side surface of the oxide semiconductor film 108 with the oxide insulating film 114 serving as a part of the second gate insulating film provided therebetween.

The gate electrode 120 is in contact with the gate electrode 104 in the channel width direction of the transistor 150 shown in FIG. 5C. That is, the potential of the gate electrode 104 and the potential of the gate electrode 120 can be the same.

In the transistor 150 shown in FIGS. 5A to 5C, the shapes of the oxide insulating film 114 and the nitride insulating film 116 serving as a second gate insulating film in the channel width direction are different from those in the transistor shown in FIGS. 1A to 1C. The shape of the gate electrode 120 is also different in accordance with the shapes of the oxide insulating film 114 and the nitride insulating film 116.

The transistor 150 shown in FIGS. 5A to 5C can be formed in the following manner, for example. After the oxide insulating film 114 and the nitride insulating film 116 are successively formed, the openings are provided, and the gate electrode 120 is formed to cover the opening.

The semiconductor device of one embodiment of the present invention which is shown in FIGS. 5A to 5C has an advantageous effect similar to that of the semiconductor device of one embodiment of the present invention which is shown in FIGS. 1A to 1C.

Note that the structures, methods, and the like described in this embodiment can be used as appropriate in combination with any of the structures, methods, and the like described in the other embodiments.

Embodiment 2

In this embodiment, the electrical characteristics of the transistor having a dual-gate structure described in Embodiment 1 that includes gate electrodes connected to each other and having the same potential are described with reference to FIGS. 6A and 6B, FIGS. 7A and 7B, FIGS. 8A and 8B, FIGS. 9A and 9B, FIGS. 10A to 10C, and FIGS. 11A to 11C.

Figure 6A:
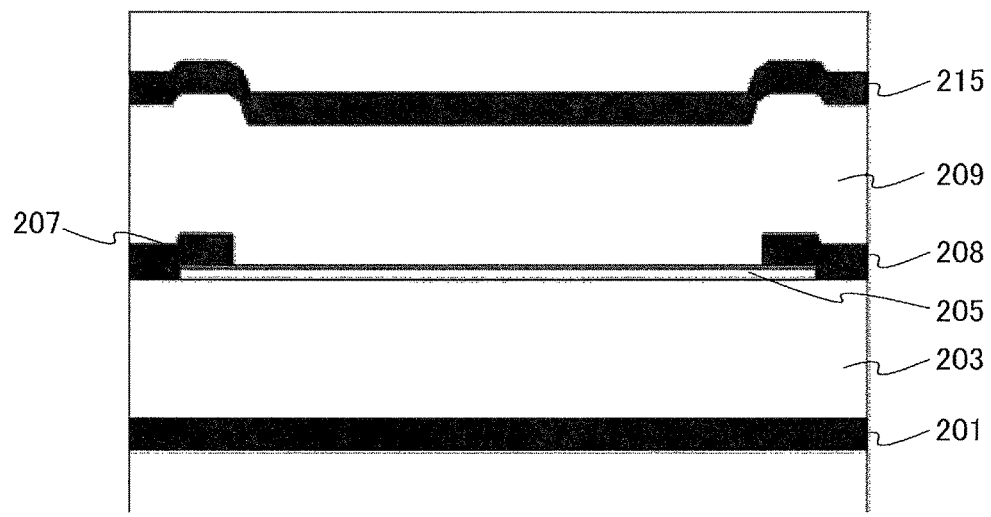
FIGS. 6A and 6B are cross-sectional views each illustrating a structure of a transistor.

Note that here, a driving method in which a gate electrode 201 and a gate electrode 215, which are shown in FIG. 6A and described later, are electrically short-circuited and supplied with a gate voltage is referred to as dual-gate driving. That is, in the dual-gate driving, a gate voltage of the gate electrode 201 is equal to a gate voltage of the gate electrode 215.

Figure 6B:
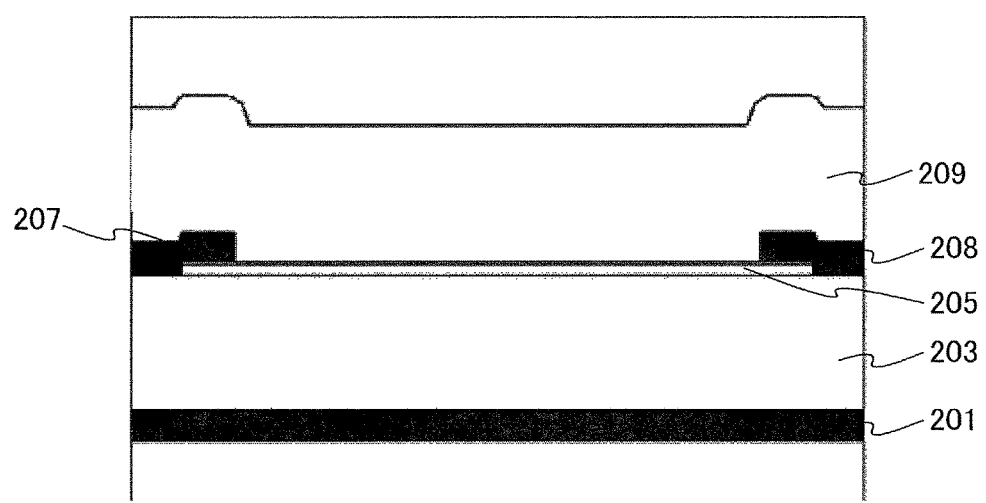

Electrical characteristics of transistors are calculated. FIGS. 6A and 6B show structures of the transistors used for the calculation. Note that a device simulation software "Atlas" manufactured by Silvaco Data Systems Inc. is used for the calculation.

A transistor having Structure 1 shown in FIG. 6A is a dual-gate transistor.

In the transistor having Structure 1, an insulating film 203 is formed over the gate electrode 201, and an oxide semiconductor film 205 is formed over the insulating film 203. A pair of electrodes 207 and 208 is formed over the insulating film 203 and the oxide semiconductor film 205, and an insulating film 209 is formed over the oxide semiconductor film 205 and the pair of electrodes 207 and 208. The gate electrode 215 is formed over the insulating film 209. The gate electrode 201 and the gate electrode 215 are connected to each other in an opening (not shown) formed in the insulating film 203 and the insulating film 209.

A transistor having Structure 2 shown in FIG. 6B is a single-gate transistor.

In the transistor having Structure 2, the insulating film 203 is formed over the gate electrode 201, and the oxide semiconductor film 205 is formed over the insulating film 203. The pair of electrodes 207 and 208 is formed over the insulating film 203 and the oxide semiconductor film 205, and the insulating film 209 is formed over the oxide semiconductor film 205 and the pair of electrodes 207 and 208.

The work function $\phi_M$ of the gate electrode 201 is set to 5.0 V. The insulating film 203 is a 100-nm-thick film with a dielectric constant of 4.1. The oxide semiconductor film 205 is a single layer of an In—Ga—Zn oxide film (In:Ga:Zn=1:1:1) layer. The band gap Eg of the In—Ga—Zn oxide film is 3.15 eV, the electron affinity $\chi$ is 4.6 eV, the dielectric constant is 15, the electron mobility is 10 cm$^2$/Vs, and the donor density $N_d$ is $3\times10^{17}$ atoms/cm$^3$. The work function $\phi_{sd}$ of the pair of electrodes 207 and 208 is 4.6 eV and the ohmic contact between the oxide semiconductor film 205 and the pair of electrodes 207 and 208 is obtained. The dielectric constant of the insulating film 209 is 4.1 and the thickness thereof is 100 nm Note that defect levels, surface scattering, and the like in the oxide semiconductor film 205 are not considered. The channel length and the channel width of the transistor are 10 μm and 100 μm, respectively.

<Reduction in Variation in Initial Characteristics>

As in the case of the transistor having Structure 1, by the dual-gate driving, variation in initial characteristics can be reduced. This is because on account of the dual-gate driving, the amount of shift in the threshold voltage $V_{th}$, which is one of $I_d$-$V_g$ characteristics, of the transistor having Structure 1 can be small as compared to that of the transistor having Structure 2.

Here, as one example, a negative shift in the threshold voltage of the $I_d$-$V_g$ characteristics in the case where a semiconductor film becomes n-type is described.

The sum of the quantity of electric charge of donor ions is Q (C), the capacitance formed by the gate electrode 201, the insulating film 203, and the oxide semiconductor film 205 is $C_{Bottom}$, the capacitance formed by the oxide semiconductor film 205, the insulating film 209, and the gate electrode 215 is $C_{Top}$. The amount of shift of $V_{th}$, $\Delta V$, of the transistor having Structure 1 in that case is expressed by Formula 1. The amount of shift of $V_{th}$, $\Delta V$, of the transistor having Structure 2 in that case is expressed by Formula 2.

[Formula 1]

$$\Delta V = -\frac{Q}{C_{Bottom} + C_{Top}} \quad (1)$$

[Formula 2]

$$\Delta V = -\frac{Q}{C_{Bottom}} \quad (2)$$

As expressed by Formula 1, by the dual-gate driving performed in the transistor having Structure 1, the capacitance between donor ions and the gate electrode becomes the sum of $C_{Bottom}$ and $C_{Top}$; thus, the amount of shift in the threshold voltage is small.

Figure 7A:
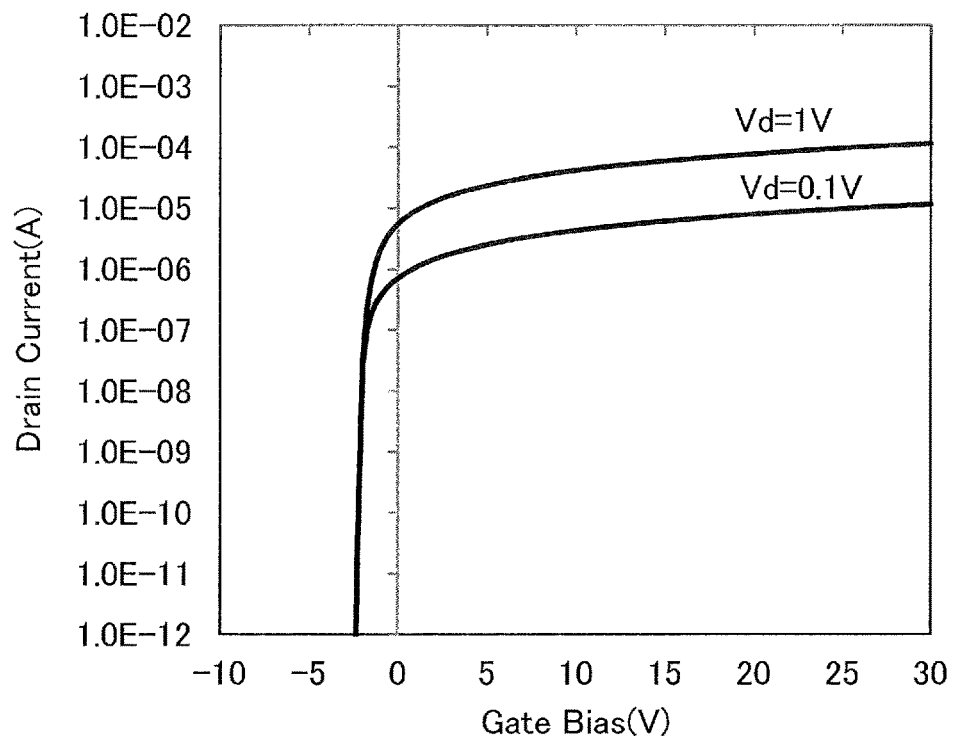
FIGS. 7A and 7B each show calculation results of current-voltage curves.
Figure 7B:
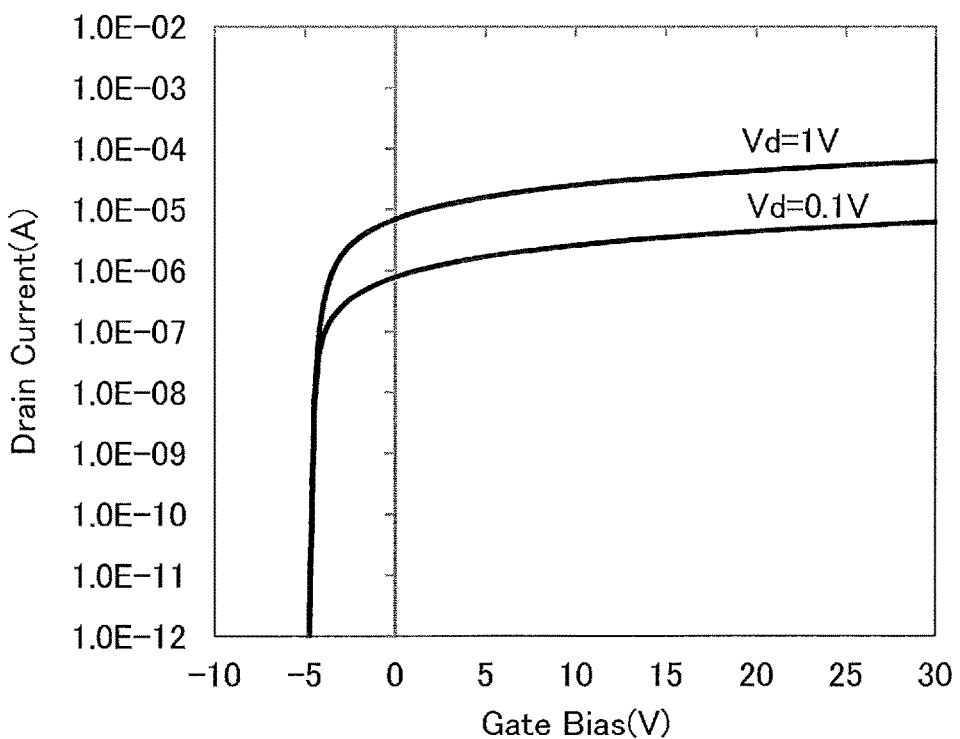

FIG. 7A shows the calculation results of the current-voltage curves at drain voltages of 0.1 V and 1 V of the transistor having Structure 1. FIG. 7B shows the calculation results of the current-voltage curves at drain voltages of 0.1 V and 1 V of the transistor having Structure 2. When the drain voltage $V_d$ is 0.1 V, the threshold voltage of the transistor having Structure 1 is −2.26 V and the threshold voltage of the transistor having Structure 2 is −4.73 V.

As in the case of the transistor having Structure 1, when the dual-gate driving is employed, the amount of shift of each threshold voltage can be small. Thus, variation in electrical characteristics among a plurality of transistors can also be small.

Note that although a negative shift due to the donor ions is considered here, a positive shift due to fixed charges, mobile charges, or negative charges (electrons trapped by acceptor-like states) in the insulating films 203 and 209 is similarly suppressed, which might reduce the variation.

<Reduction in Degradation Due to −GBT Stress Test>

By the dual-gate driving performed in the transistor having Structure 1, degree of degradation due to a −GBT stress test can be low. Some reasons why degree of degradation due to a −GBT stress test can be low are described below.

Figure 8A:
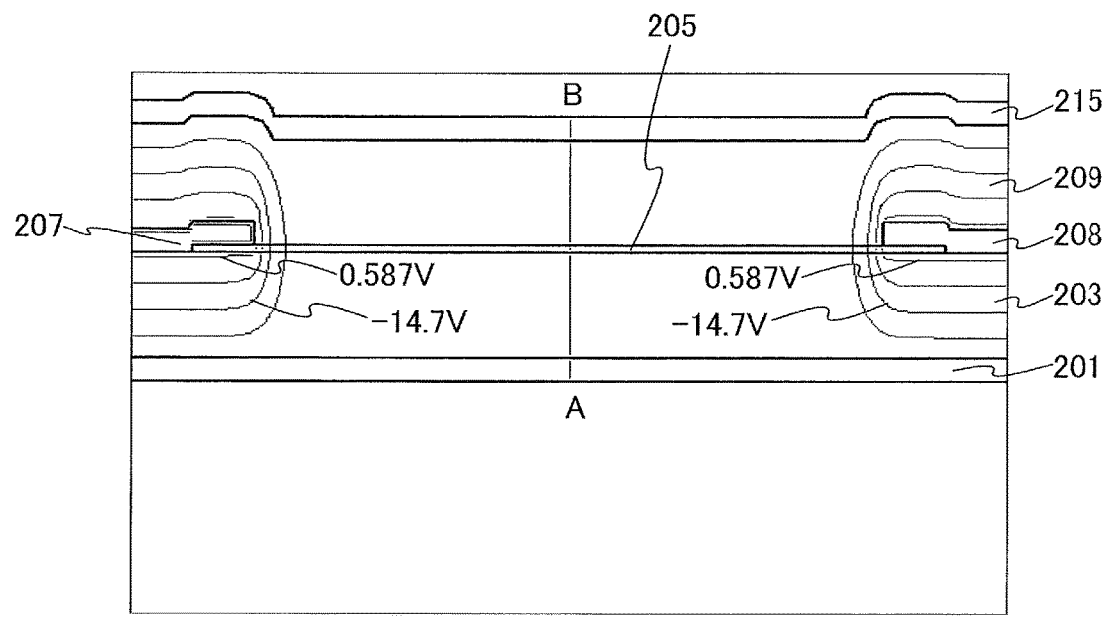
FIGS. 8A and 8B illustrate calculation results of potentials of a transistor.
Figure 8B:
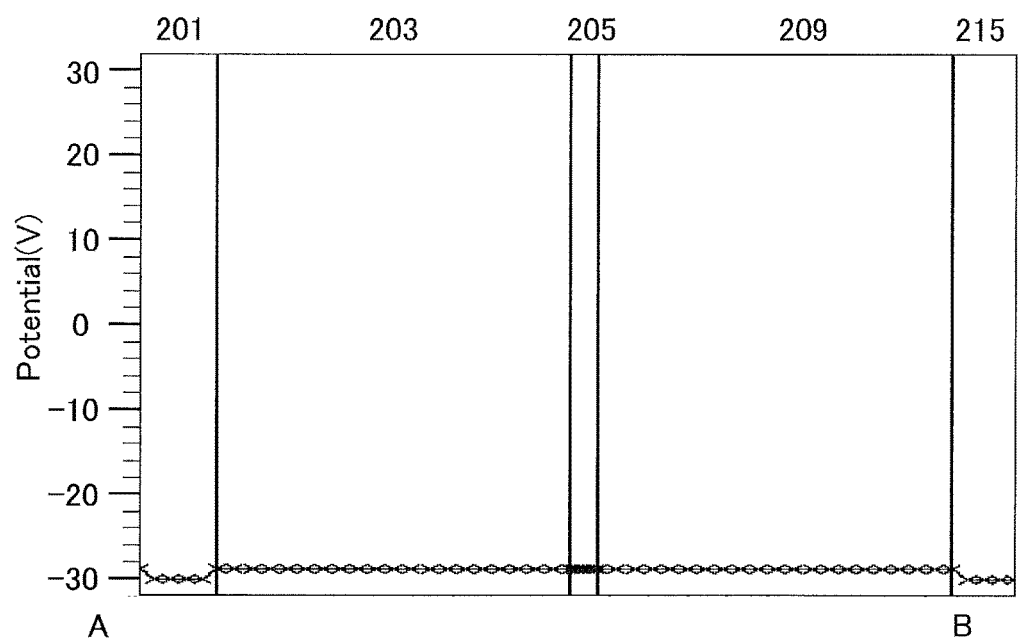

One of the reasons is that electrostatic stress is not caused on account of the dual-gate driving. FIG. 8A is a diagram in which potential contour lines are plotted in the case where −30 V is applied to each of the gate electrodes 201 and 215 in the transistor having Structure 1. FIG. 8B shows potentials at the cross section A-B in FIG. 8A.

The oxide semiconductor film 205 is an intrinsic semiconductor, and when a negative voltage is applied to the gate electrodes 201 and 215 and the oxide semiconductor film 205 is fully depleted, no charge exists between the gate electrodes 201 and 215. With this state, when the same potential is supplied to the gate electrodes 201 and 215, as illustrated in FIG. 8B, the potential of the gate electrode 201 becomes completely equal to that of the gate electrode 215. Since the potentials are equal to each other, electrostatic stress is not caused on the insulating film 203, the oxide semiconductor film 205, and the insulating film 209. As a result, phenomena causing degradation due to the −GBT stress test, such as mobile ions and trap and detrap of carriers in the insulating films 203 and 209, do not occur.

Another reason is that an external electric field of an FET can be blocked in the case of the dual-gate driving. Illustrated here are a model in which charged particles in the air are adsorbed on the gate electrode 215 in the transistor having Structure 1 illustrated in FIG. 6A and a model in which charged particles in the air are adsorbed on the insulating film 209 in the transistor having Structure 2 illustrated in FIG. 6B.

Figure 9A:
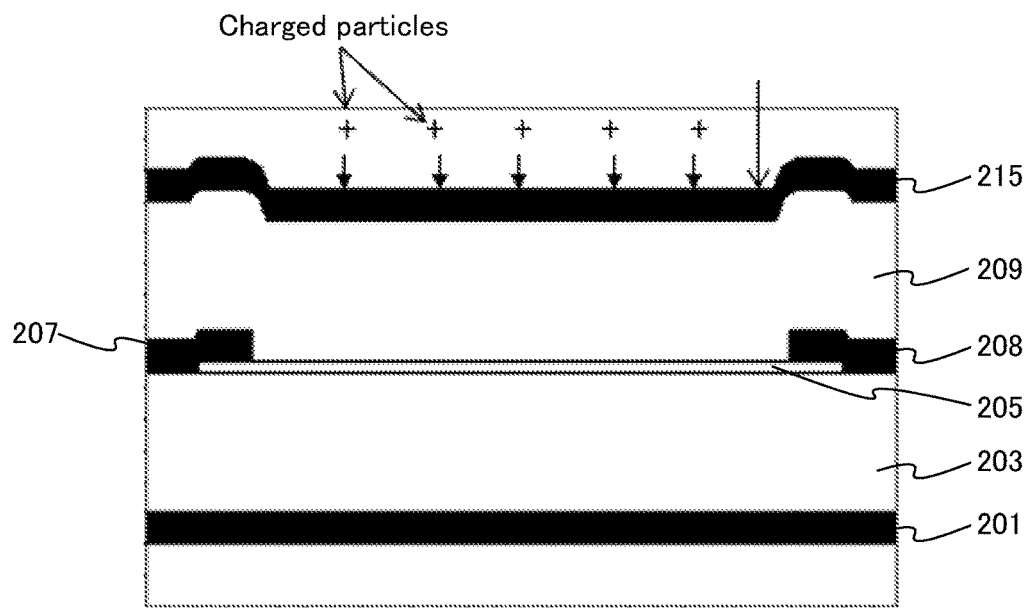
FIGS. 9A and 9B illustrate a model.
Figure 9B:
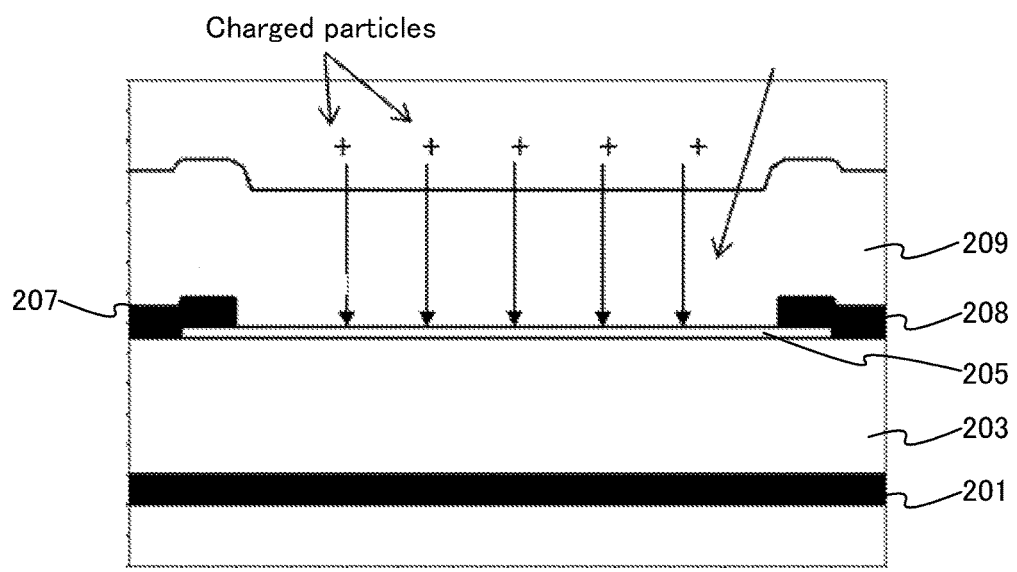

As illustrated in FIG. 9B, in the transistor having Structure 2, positively charged particles in the air are adsorbed on a surface of the insulating film 209. When a negative voltage is applied to the gate electrode 201, positively charged particles are adsorbed on the insulating film 209. As a result, as indicated by arrows in FIG. 9B, an electric field of the positively charged particles affects the interface of the oxide semiconductor film 205 with the insulating film 209, so that a state similar to the state when a positive bias is applied is brought about. As a result, the threshold voltage might shift in the negative direction.

In contrast, even if positively charged particles are adsorbed on a surface of the gate electrode 215 in the transistor having Structure 1 illustrated in FIG. 9A, as indicated by arrows in FIG. 9A, the gate electrode 215 blocks the electric field of the positively charged particles; thus, the positively charged particles do not affect the electrical characteristics of the transistor. In sum, the transistor can be electrically protected against external charges by the gate electrode 215, leading to suppression of the degradation due to the −GBT stress test.

For the above two reasons, in the transistor operated by the dual-gate driving, the degradation due to the −GBT stress test can be suppressed.

<Suppression of Changes in Rising Voltages of On-State Current at Different Drain Voltages>

Here, in the case of Structure 1, changes in the rising voltages of on-state current at different drain voltages and a cause of the changes are described.

Figure 10A:
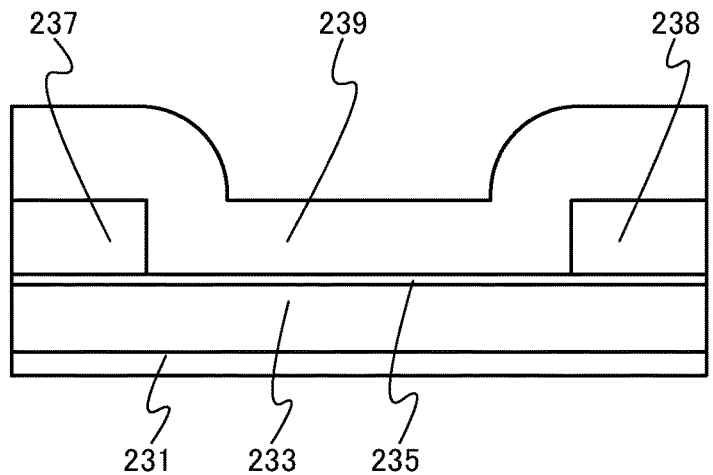
FIGS. 10A to 10C illustrate a model.
Figure 10B:
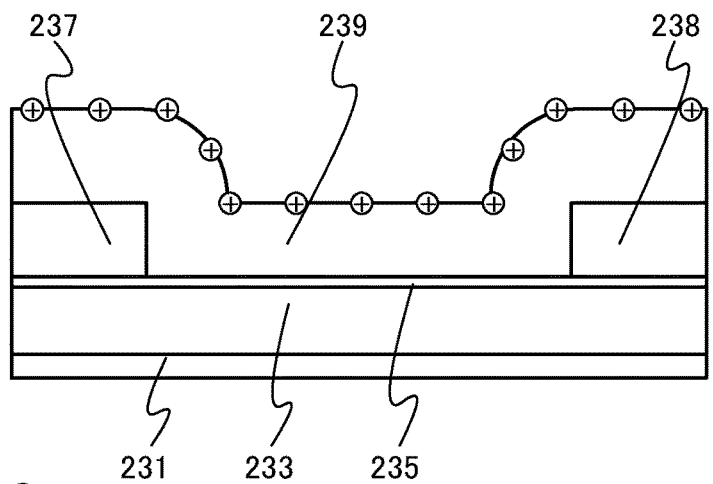
Figure 10C:
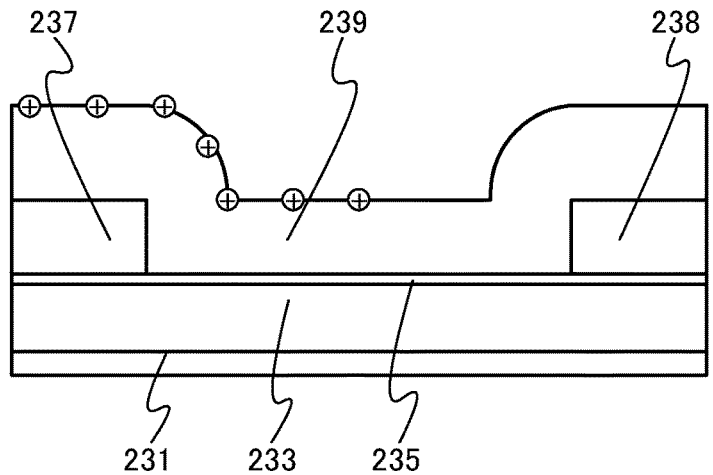

In a transistor illustrated in FIGS. 10A to 10C, a gate insulating film 233 is provided over a gate electrode 231, and an oxide semiconductor film 235 is provided over the gate insulating film 233. A pair of electrodes 237 and 238 are provided over the oxide semiconductor film 235, and an insulating film 239 is provided over the gate insulating film 233, the oxide semiconductor film 235, and the pair of electrodes 237 and 238.

Note that in the calculation, the work function $\phi_M$ of the gate electrode 231 is set to 5.0 eV. The gate insulating film 233 has a layered structure including a 400-nm-thick film having a dielectric constant of 7.5 and a 50-nm-thick film having a dielectric constant of 4.1. The oxide semiconductor film 235 is a single-layer In—Ga—Zn oxide film (In:Ga: Zn=1:1:1). The band gap $E_g$ of the In—Ga—Zn oxide film is 3.15 eV, the electron affinity $\chi$ is 4.6 eV, the dielectric constant is 15, the electron mobility is 10 cm²/Vs, and the donor density $N_d$ is $1\times10^{13}$/cm³. The work function $\phi_{sd}$ of the pair of electrodes 237 and 238 is set to 4.6 eV. Ohmic junction is made between the oxide semiconductor film 235 and each of the pair of electrodes 237 and 238. The insulating film 239 is a 550-nm-thick film having a dielectric constant of 3.9. Note that defect levels, surface scattering, and the like in the oxide semiconductor film 235 are not considered. Further, the channel length and the channel width of the transistor are 3 μm and 50 μm, respectively.

Next, models of a transistor illustrated in FIG. 10A in which positively charged particles are adsorbed on a surface of the insulating film 239 are illustrated in FIGS. 10B and 10C. FIG. 10B illustrates an assumed structure in which positive fixed charges are uniformly adsorbed on the surface of the insulating film 239. FIG. 10C illustrates an assumed structure in which positive fixed charges are adsorbed on a part of the surface of the insulating film 239.

Figure 11A:
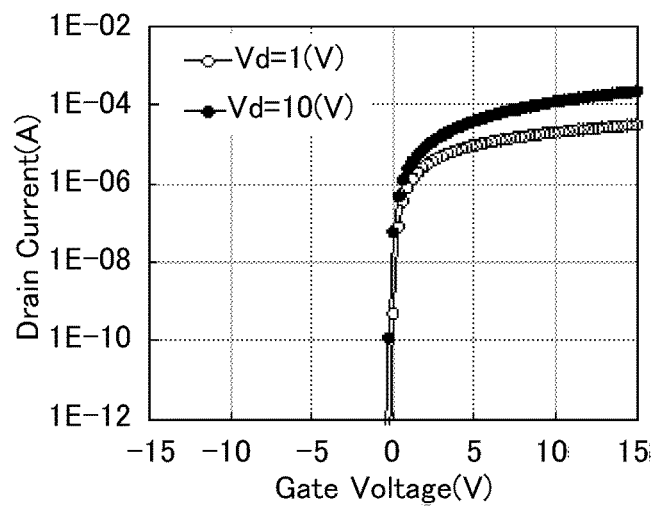
FIGS. 11A to 11C each illustrate calculation results of current-voltage curves.
Figure 11B:
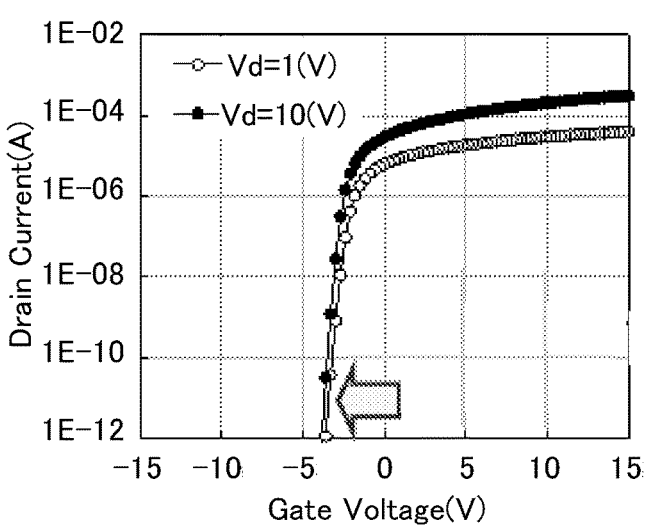
Figure 11C:
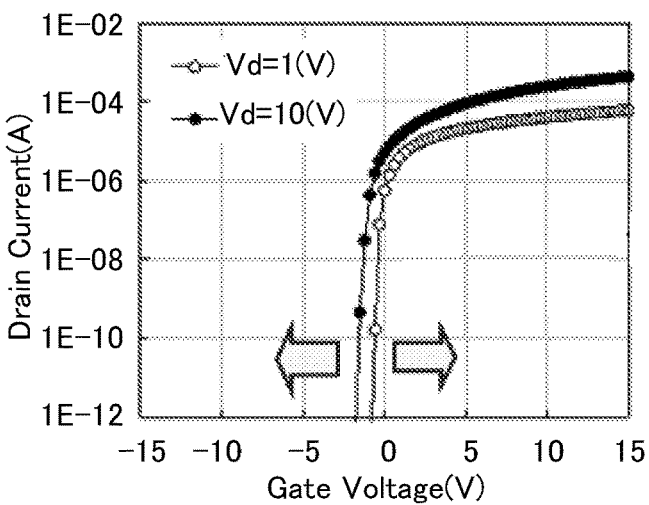

Calculation results of the electrical characteristics of the transistors illustrated in FIGS. 10A to 10C are shown in FIGS. 11A to 11C, respectively.

In the case where it is assumed that no positive fixed charge is adsorbed on the insulating film 239 in the transistor illustrated in FIG. 10A, the rising voltage at a drain voltage $V_d$ of 1 V approximately corresponds to that at a drain voltage $V_d$ of 10 V as shown in FIG. 11A.

In contrast, in the case where it is assumed that positive fixed charges are uniformly adsorbed on the insulating film 239 in the transistor illustrated in FIG. 10B, the rising voltage at a drain voltage $V_d$ of 1 V approximately corresponds to that at a drain voltage $V_d$ of 10 V but the threshold voltages shift in the negative direction as shown in FIG. 11B.

In the case where it is assumed that positive fixed charges are partly adsorbed on the insulating film 239 in the transistor illustrated in FIG. 10C, the rising voltage at a drain voltage $V_d$ of 1 V is different from that at a drain voltage $V_d$ of 10 V as shown in FIG. 11C.

Since the gate electrode 215 is provided in the transistor having Structure 1, as described in <Reduction in degradation due to −GBT stress test>, the gate electrode 215 blocks the electric field of external charged particles; thus, the charged particles do not affect the electrical characteristics of the transistor. In other words, the oxide semiconductor film can be electrically protected against external charges by the gate electrode 215, and changes in the rising voltages of on-state current at different drain voltages can be suppressed.

As described above, in the case where a dual-gate structure is employed and a given voltage is given to each gate electrode, degradation due to a −GBT stress test and changes in the rising voltages of on-state current at different drain voltages can be suppressed. Moreover, in the case where a dual-gate structure is employed and voltages having the same potential are given to each gate electrode, variation in initial characteristics can be reduced, degradation due to a −GBT stress test can be suppressed, and changes in the rising voltages of on-state current at different drain voltages can be suppressed.

<Distance Between End Portion of Gate Electrode and End Portion of Oxide Semiconductor Film in Channel Width Direction and Amount of Change in Threshold Voltage>

Figure 12A:
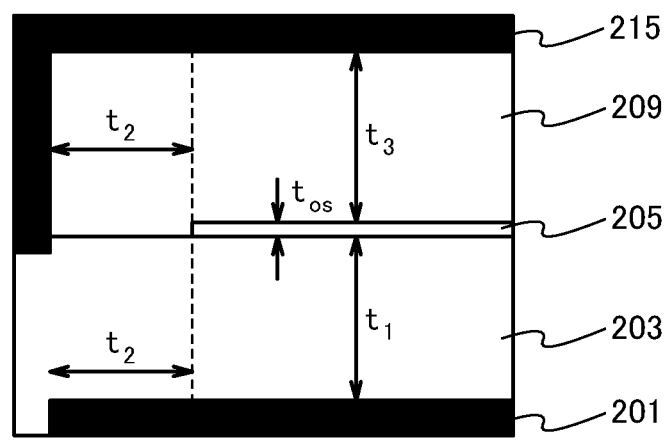
FIGS. 12A to 12C are cross-sectional views each illustrating a structure of a transistor.
Figure 12B:
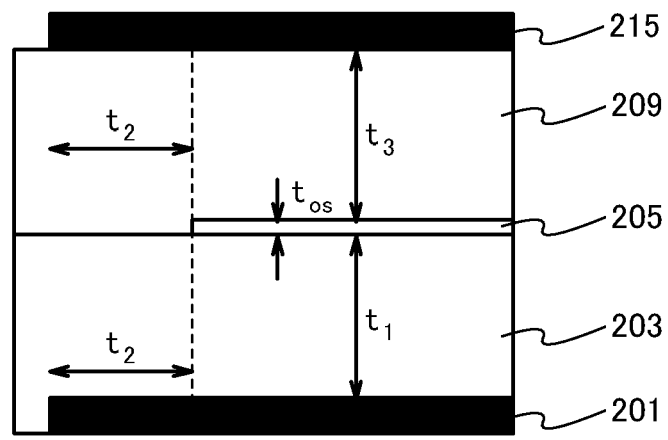
Figure 12C:
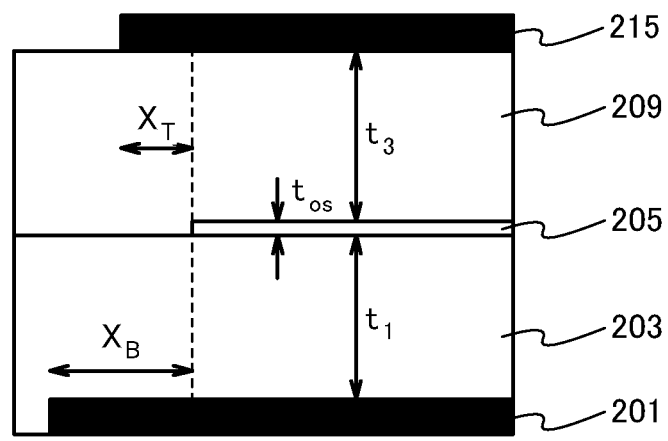

FIGS. 12A to 12C are each a schematic cross-sectional view of the transistor having Structure 1 in the channel width direction. Note that the scale of components of the schematic cross-sectional view of the transistor shown in FIGS. 12A to 12C is different from that of components of Structure 1 shown in FIG. 6A.

Structure 3 (see FIG. 12A) is considered. Structure 3 is obtained in such a manner that, in the transistor having Structure 1, the end portion of the gate electrode 215 is positioned beyond the oxide semiconductor film 205 so that the side surface of the oxide semiconductor film 205 and the gate electrode 215 face each other in the channel width direction of the transistor shown in FIG. 6A.

It is assumed that a transistor having Structure 3 includes donor ions with a quantity of electric charge Q per unit area ($C/m^2$) on the side surface of the oxide semiconductor film 205. The capacitance per unit area which is formed between the electric charge and the gate electrode 201 is represented by $C_{Bottom}$. The coupling capacitance per unit area which is formed between the electric charge and the gate electrode 215 is represented by $C_{Top}$. The capacitance per unit area which is formed between the electric charge and the gate electrode 215 in the channel width direction is represented by $C_{Side}$. The thickness of a region of the insulating film 203 which is under the oxide semiconductor film 205 is represented by $t_1$. The thickness of a region of the insulating film 209 between the side surface of the oxide semiconductor film 205 and the gate electrode 215 is represented by $t_2$. The thickness of a region of the insulating film 209 which is on the oxide semiconductor film 205 is represented by $t_3$. The thickness of the oxide semiconductor film 205 is represented by $t_{os}$. The dielectric constant of the insulating film is represented by $\varepsilon$. With these notations, $C_{Bottom}$, $C_{Top}$, and $C_{Side}$ are approximated by the following formulae.

[Formula 3]
$$C_{Bottom} = \varepsilon \frac{1}{t_1 + t_{os}/2}\left[\frac{1}{2} + \frac{(t_1 + t_{os})t_2}{(t_1 + t_{os})^2 + t_2^2}\right] \quad (3)$$

[Formula 4]
$$C_{Top} = \varepsilon \frac{1}{t_3 + t_{os}/2}\left[\frac{1}{2} + \frac{(t_3 + t_{os})t_2}{(t_3 + t_{os})^2 + t_2^2}\right] \quad (4)$$

[Formula 5]
$$C_{Side} = \frac{\varepsilon}{t_2} \quad (5)$$

At this time, $\Delta V_3$ is expressed by Formula (6); $\Delta V_3$ refers to the amount of $V_{th}$ shift due to the quantity of electric charge Q when the transistor having Structure 3 is subjected to dual-gate driving.

[Formula 6]
$$\Delta V_3 = -\frac{Q}{C_{Bottom} + C_{Top} + C_{Side}} \quad (6)$$

Next, Structure 4 (see FIG. 12B) is considered. In Structure 4, the gate electrode does not face the side surface of the oxide semiconductor film 205, though the gate electrode 201 and the gate electrode 215 protrude more than the oxide semiconductor film 205 by $t_2$ in the channel width direction. At this time, $\Delta V_4$, the amount of $V_{th}$ shift due to the quantity of electric charge Q when the transistor having Structure 4 is subjected to dual-gate driving, is expressed by Formula (7).

[Formula 7]
$$\Delta V_4 = -\frac{Q}{C_{Bottom} + C_{Top}} \quad (7)$$

When Formula (6) and Formula (7) are expressed using a ratio, Formula (8) is obtained.

[Formula 8]
$$\frac{\Delta V_3}{\Delta V_4} = \frac{C_{Bottom} + C_{Top}}{C_{Bottom} + C_{Top} + C_{Side}} \quad (8)$$

The right side of Formula (8) is smaller than 1. Hence, under the conditions of the same quantity of electric charge Q, the amount of $V_{th}$ shift due to the quantity of electric charge Q of Structure 3 shown in FIG. 12A can be smaller than that of Structure 4 shown in FIG. 12B.

Note that the amount of $V_{th}$ shift of the transistor can be expressed using Formula (6) and Formula (7) only when the $V_{th}$ shift occurs mainly by the quantity of electric charge Q on the side surface of the oxide semiconductor film 205. For example, when one of the gate electrodes 201 and 215 does not extend farther than the oxide semiconductor film 205 in the channel width direction, a parasitic channel is formed depending on the quantity of electric charge Q of donor ions on the side surface of the oxide semiconductor film 205 in some cases. In such cases, when Structure 3 or Structure 4 is used, the effect of the quantity of electric charge Q can be reduced on the basis of Formula (6) or Formula (7), respectively.

In the above description, the donor ion on the side surface of the oxide semiconductor film 205 is particularly regarded as the origin of the quantity of electric charge Q. Similar argument can be made using a fixed charge in the insulating film, at the interface with the insulating film, or in the oxide semiconductor film, or an electron or a hole which is captured by a trap state, provided that these are main causes of the $V_{th}$ shift.

In Structure 5 (see FIG. 12C), which is a more generalized structure than Structure 4, the gate electrode 201 and the gate electrode 215 extend farther by $X_B$ and $X_T$, respectively, than the oxide semiconductor film 205 in the channel width direction. At this time, $C_{Bottom}$ and $C_{Top}$ are expressed by Formula (9) and Formula (10), respectively.

[Formula 9]
$$C_{Bottom} = \varepsilon \frac{1}{t_1 + t_{os}/2}\left[\frac{1}{2} + \frac{(t_1 + t_{os})X_B}{(t_1 + t_{os})^2 + X_B^2}\right] \quad (9)$$

[Formula 10]
$$C_{Top} = \varepsilon \frac{1}{t_3 + t_{os}/2}\left[\frac{1}{2} + \frac{(t_3 + t_{os})X_T}{(t_3 + t_{os})^2 + X_T^2}\right] \quad (10)$$

When $X_B = t_1 + t_{os}$ and $X_T = t_3 + t_{os}$ are satisfied in Formula (9) and Formula (10), respectively, maximum values $C_{Bottom}^{Max}$ and $C_{Top}^{Max}$ are expressed by Formula (11) and Formula (12).

[Formula 11]

$$C_{Bottom}^{Max} = \varepsilon \frac{1}{t_1 + t_{os}/2} \quad (11)$$

[Formula 12]

$$C_{Top}^{Max} = \varepsilon \frac{1}{t_3 + t_{os}/2} \quad (12)$$

Hence, $X_B = t_1 + t_{os}$ and $X_T = t_3 + t_{os}$ are satisfied to minimize the amount of $V_{th}$ shift on the basis of Formula (7).

Embodiment 3

In this embodiment, a display device using a semiconductor device which is one embodiment of the present invention will be described with reference to drawings. Note that in FIGS. 13A and 13B, FIG. 14, FIG. 15, FIG. 16, FIG. 17, and FIGS. 18A and 18B, portions similar to those denoted by the reference numerals in the above embodiments and portions having functions similar to those denoted by the reference numerals in above embodiments are given by the same reference numerals, and detailed description thereof is omitted.

Figure 13A:
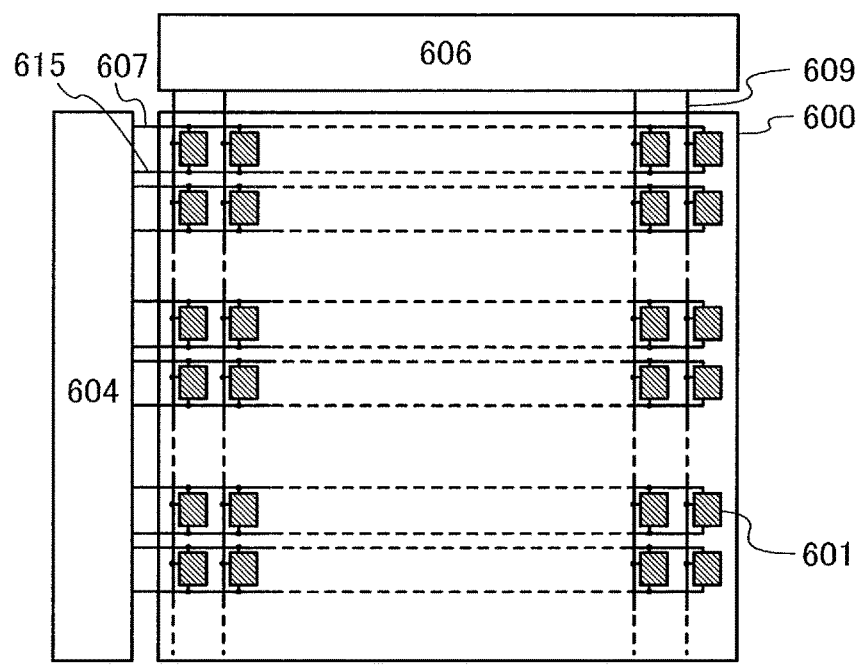
FIGS. 13A and 13B are a block diagram and a circuit diagram illustrating one embodiment of a light-emitting device.

FIG. 13A is a block diagram of an example of the display device. The display device illustrated in FIG. 13A includes a pixel portion 600; a scan line driver circuit 604; a signal line driver circuit 606; m scan lines 607 which are arranged in parallel or almost in parallel to each other and whose potentials are controlled by the scan line driver circuit 604; and n signal lines 609 which are arranged in parallel or almost in parallel to each other and whose potentials are controlled by the signal line driver circuit 606. The pixel portion 600 includes a plurality of pixels 601 arranged in a matrix. The scan line driver circuit 604 and the signal line driver circuit 606 are collectively referred to as a driver circuit portion in some cases.

Each scan line 607 is electrically connected to the n pixels 601 in the corresponding row among the pixels 601 arranged in m rows and n columns in the pixel portion 600. Each signal line 609 is electrically connected to the m pixels 601 in the corresponding column among the pixels 601 arranged in m rows and n columns. Note that m and n are each an integer of 1 or more. Each capacitor line 615 is electrically connected to the n pixels 601 in the corresponding row among the pixels 601 arranged in m rows and n columns. Note that in the case where the capacitor lines 615 are arranged in parallel or almost in parallel along the signal lines 609, each capacitor line 615 is electrically connected to the m pixels 601 in the corresponding column among the pixels 601 arranged in m rows and n columns.

The semiconductor device described in Embodiment 1 can be used for the pixel 601 illustrated in FIG. 13A.

Figure 13B:
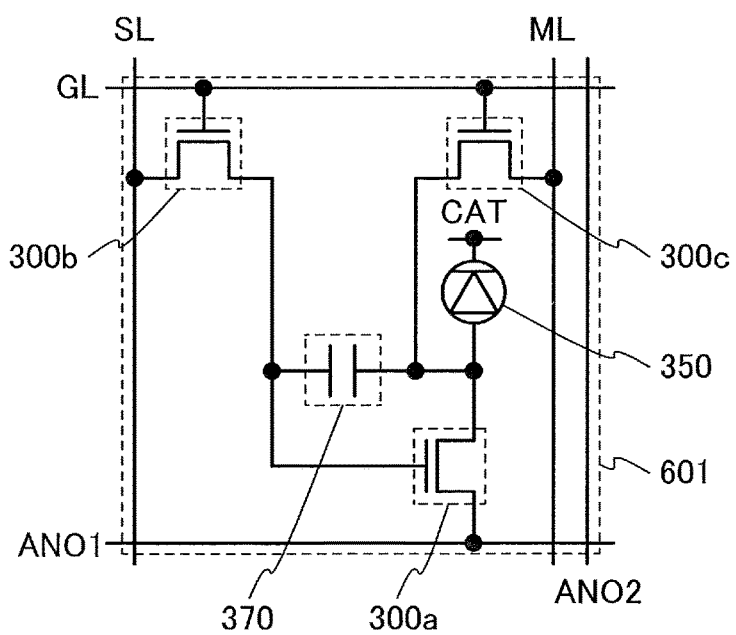

FIG. 13B illustrates a circuit configuration that can be used for the pixels 601 in the display device illustrated in FIG. 13A.

The pixel 601 illustrated in FIGS. 13A and 13B includes a transistor 300b which controls writing of a data signal, a transistor 300a which controls driving of the pixel, a transistor 300c, a capacitor 370, and a light-emitting element 350.

One of a source electrode and a drain electrode of the transistor 300b is electrically connected to a signal line SL to which a data signal is supplied. A gate electrode of the transistor 300b is electrically connected to a scan line GL to which a gate signal is supplied.

The transistor 300b has a function of controlling whether to write a data signal by being turned on or off.

One of a source electrode and a drain electrode of the transistor 300a is electrically connected to a wiring ANO1 serving as an anode line, and the other is electrically connected to one electrode of the light-emitting element 350. The gate electrode of the transistor 300a is electrically connected to the other of the source and drain electrodes of the transistor 300b and the one electrode of the capacitor 370.

The transistor 300a has a function of controlling current flowing through the light-emitting element 350 by being turned on or off.

One of a source electrode and a drain electrode of the transistor 300c is connected to a wiring ML to which a reference potential of data is supplied, and the other is electrically connected to the one electrode of the light-emitting element 350 and the other electrode of the capacitor 370. Moreover, a gate electrode of the transistor 300c is electrically connected to the scan line GL to which the gate signal is supplied.

The transistor 300c has a function of adjusting the current flowing through the light-emitting element 350. For example, in the case where the transistors 300a deteriorate or vary in threshold voltage or field-effect mobility, current that flows in each light-emitting element 350 can be corrected through monitoring of current flowing in the wiring ML connected to one of the source and the drain electrodes of each transistor 300c. The wiring ML can be supplied with, for example, voltage lower than or equal to the threshold voltage of the light-emitting element 350.

One of the pair of electrodes of the capacitor 370 is electrically connected to one of the source electrode and the drain electrode of the transistor 300b and the gate electrode of the transistor 300a, and the other of the pair of electrodes of the capacitor 370 is electrically connected to the other of the source electrode and the drain electrode of the transistor 300b and one electrode of the light-emitting element 350.

In the structure of the pixel 601 in FIG. 13B, the capacitor 370 functions as a storage capacitor for storing written data.

The one of the pair of electrodes of the light-emitting element 350 is electrically connected to the other of the source and drain electrodes of the transistor 300a, the other electrode of the capacitor 370, and the other of the source and drain electrodes of the transistor 300c. Furthermore, the other of the pair of electrodes of the light-emitting element 350 is electrically connected to a wiring CAT serving as a cathode.

As the light-emitting element 350, an organic electroluminescent element (also referred to as an organic EL element) or the like can be used, for example. Note that the light-emitting element 350 is not limited to an organic EL element; an inorganic EL element including an inorganic material may be used.

A wiring ANO2 extends in a direction parallel to the wiring ML. The wiring ANO2 is connected to the wiring ANO1 serving as an anode line, so that the wiring resistance of the wirings ANO1 and ANO2 can be reduced. Thus, voltage drop of the wiring in the light-emitting device using a large substrate can be reduced; accordingly, unevenness in luminance of the light-emitting device can be reduced.

One of a high power supply potential VDD and a low power supply VSS is supplied to the wiring ANO1 and the wiring ANO2, and the other of the high power supply VDD and the low power supply Vss is supplied to the wiring CAT.

In the structure of FIG. 13B, the high power supply potential VDD is supplied to the wirings ANO1 and ANO2, and the low power supply potential VSS is supplied to the wiring CAT.

In the display device including the pixel 601 in FIG. 13B, the pixels 601 are sequentially selected row by row by the scan line driver circuit, whereby the transistor 300b is turned on and a data signal is written.

When the transistor 300b is turned off, the pixels 601 in which the data has been written are brought into a holding state. Moreover, the transistor 300b is connected to the capacitor 370; thus, the written data can be held for a long time. Further, the amount of current flowing between the source electrode and the drain electrode of the transistor 300a is controlled. The light-emitting element 350 emits light with a luminance corresponding to the amount of flowing current. This operation is sequentially performed row by row; thus, an image can be displayed.

Next, a structure which can be used for the pixel 601 illustrated in FIGS. 13A and 13B will be described below with reference to FIG. 14, FIG. 15, FIG. 16, FIG. 17, and FIGS. 18A and 18B.

Figure 14:
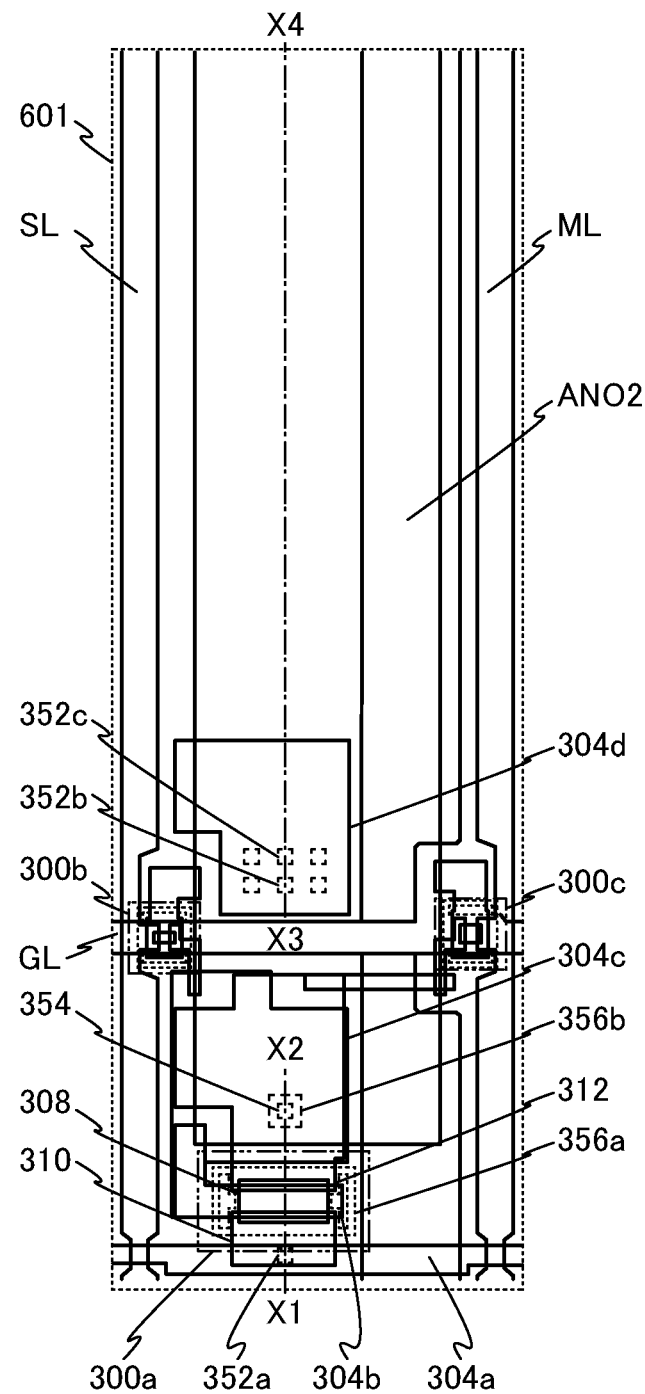
FIG. 14 is a top view illustrating one embodiment of a light-emitting device.
Figure 15:
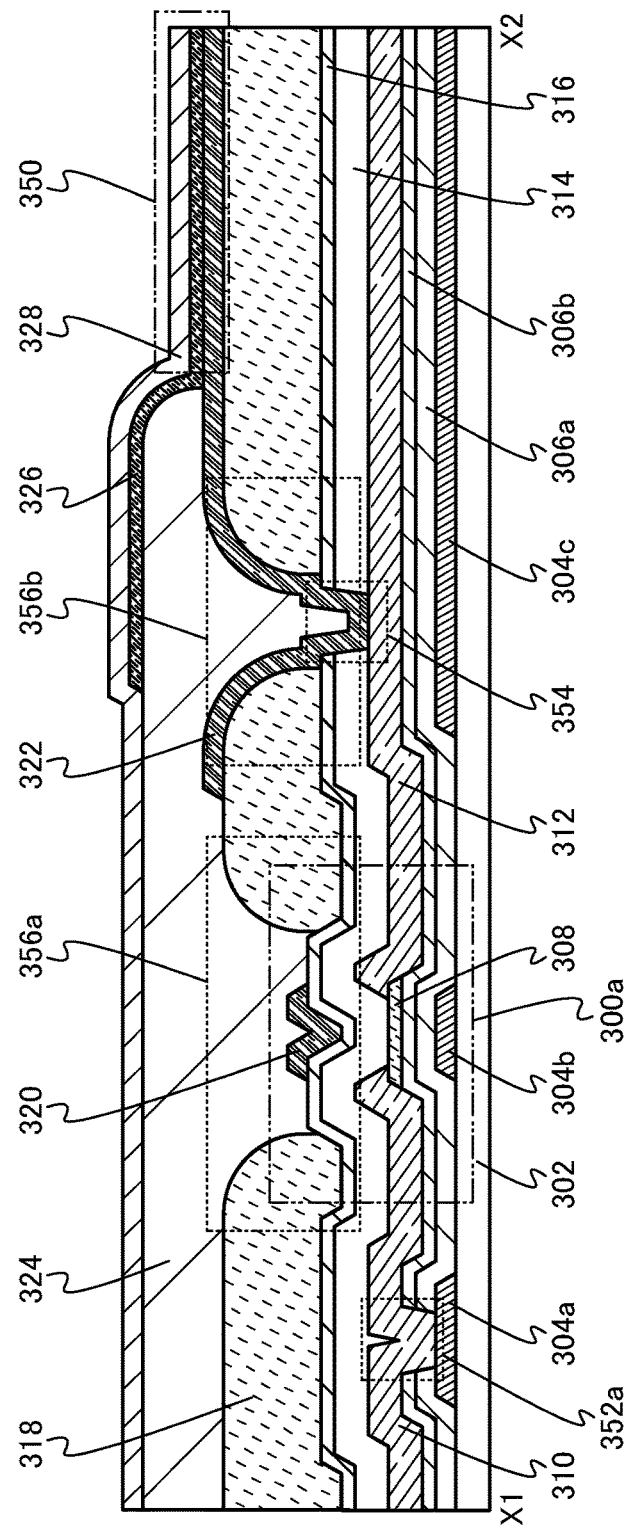
FIG. 15 is a cross-sectional view illustrating one embodiment of a light-emitting device.
Figure 16:
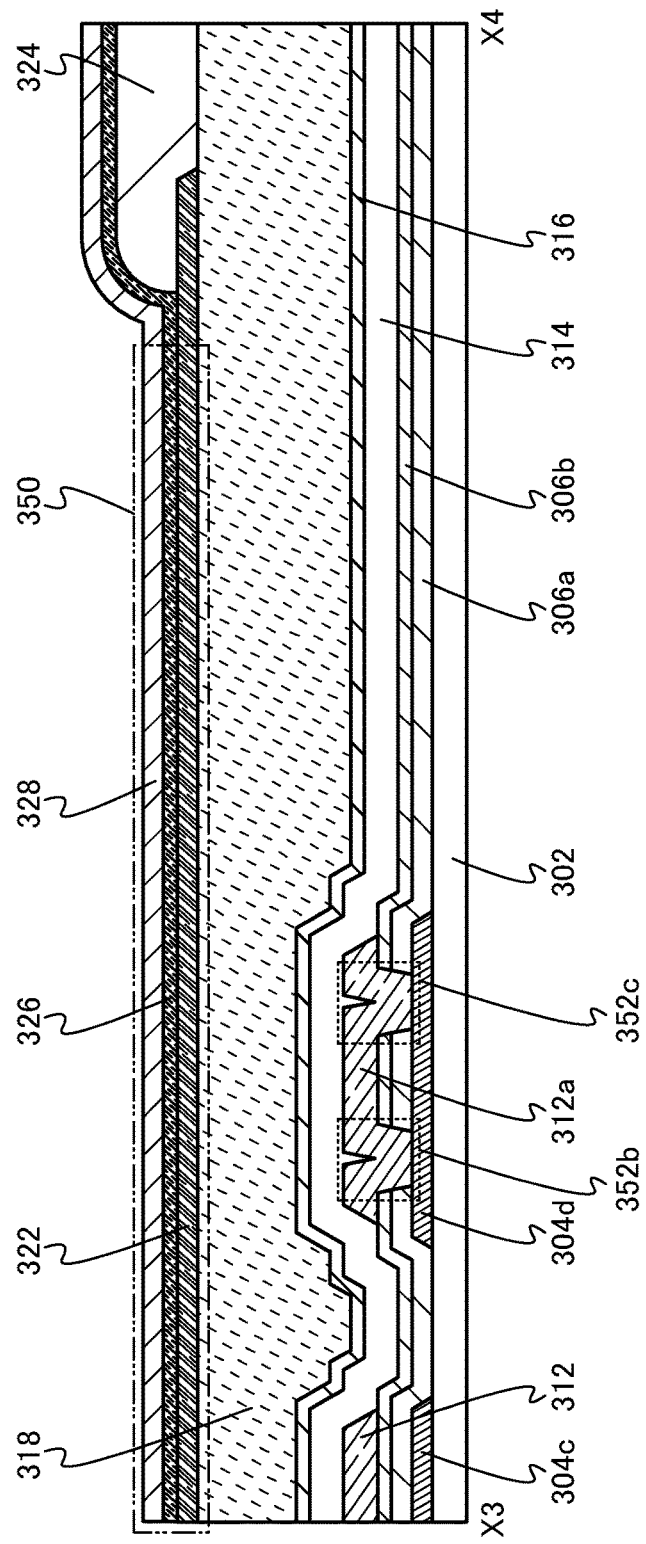
FIG. 16 is a cross-sectional view illustrating one embodiment of a light-emitting device.

FIG. 14 shows a part of a top view of a pixel which can be used for the pixel 601. FIG. 15 shows a cross section taken along dashed-dotted line X1-X2 in FIG. 14. FIG. 16 shows a cross section taken along dashed-dotted line X3-X4 in FIG. 14.

In FIG. 14, a wiring GL serving as a scan line extends substantially perpendicularly to the signal line (in the horizontal direction in the drawing). A wiring SL serving as a signal line extends substantially perpendicularly to the scan line (in the vertical direction in the drawing). The wiring ML which is supplied with a reference potential of data extends in a direction parallel to the wiring SL. The wiring ANO2 serving as an anode line extends in a direction parallel to the wiring SL and the wiring ML.

The transistors 300a, 300b, and 300c are provided in the pixel 601. Note that each of the transistors 300a, 300b, and 300c includes a conductive film serving as a gate electrode, a gate insulating film, an oxide semiconductor film which is over the gate insulating film and in which a channel region is formed, and conductive films which are electrically connected to the oxide semiconductor film and serve as a pair of electrodes. For example, the transistor 300a includes a gate electrode 304b, a gate insulating film (not shown), an oxide semiconductor film 308, and electrodes 310 and 312. The gate electrode of the transistor 300a is electrically connected to the wiring GL. One of the electrodes 310 and 312 of the transistor 300a is electrically connected to the wiring SL.

Note that although the structures of the transistors 300b and 300c are not particularly mentioned, the transistors 300b and 300c can have structures similar to the structure of the transistor 300a.

An electrode 304a is electrically connected to the electrode 310 in an opening 352a. The electrode 312 is electrically connected to a pixel electrode 322 in openings 354 and 356b. An electrode 304d is electrically connected to an electrode 312a in openings 352b and 352c. Note that the pixel electrode 322 and the electrode 312a are not shown in FIG. 14.

An electrode 304c is formed under the electrode 312. The electrode 312, a dielectric film formed under the electrode 312, and the electrode 304c form a capacitor. The capacitor corresponds to the capacitor 370 shown in FIG. 13B.

Next, cross sections taken along dashed-dotted lines X1-X2 and X3-X4 in FIG. 14 are described with reference to FIG. 15 and FIG. 16.

The pixel shown in FIG. 15 and FIG. 16 includes a substrate 302; a gate electrode 304b and the electrodes 304a, 304c, and 304d over the substrate 302; insulating films 306a and 306b which are formed over the substrate 302, the gate electrode 304b, and the electrodes 304a, 304c, and 304d; the oxide semiconductor film 308 over the insulating film 306b; the pair of electrodes 310 and 312 over the oxide semiconductor film 308; the electrode 312a which is formed in the same step as the electrode 312; an oxide insulating film 314 which is formed over the oxide semiconductor film 308 and the electrodes 310, 312, and 312a; a nitride insulating film 316 which is formed over the oxide insulating film 314; a gate electrode 320 which is formed over the nitride insulating film 316 to overlap the oxide semiconductor film 308; the insulating film 318 which is formed over the nitride insulating film 316 and has an opening in a position overlapping the oxide semiconductor film 308; the pixel electrode 322 which is formed in the same step as the gate electrode 320 and formed over the insulating film 318; and an insulating film 324 which is formed to cover the transistor and an end portion of the pixel electrode 322.

The gate electrode 304b, the insulating films 306a and 306b, the oxide semiconductor film 308, the electrodes 310 and 312, the oxide insulating film 314, the nitride insulating film 316, and the gate electrode 320 form the transistor 300a. The insulating films 306a and 306b serve as a first gate insulating film of the transistor 300a, and the oxide insulating film 314 and the nitride insulating film 316 serve as a second gate insulating film of the transistor 300a.

In a region between the electrode 312 and the electrode 304c, the insulating films 306a and 306b serve as a dielectric. That is, the electrode 312, the insulating films 306a and 306b, and the electrode 304c form the capacitor.

An EL layer 326 is formed over the pixel electrode 322 and the insulating film 318. An electrode 328 is formed over the EL layer 326. The pixel electrode 322, the EL layer 326, and the electrode 328 form the light-emitting element 350. The EL layer 326 includes at least a light-emitting layer containing a light-emitting substance. In addition to the light-emitting layer, a functional layer such as a hole-injection layer, a hole-transport layer, an electron-transport layer, an electron-injection layer, or a charge generation layer may be formed. In the EL layer 326, electrons and holes are injected from a pair of electrodes (here, the pixel electrode 322 and the electrode 328), and current flows. The electrons and holes are recombined, and thus, the light-emitting substance is excited. The light-emitting substance returns to a ground state from the excited state, thereby emitting light.

The insulating film 318 may have a function of planarizing unevenness formed under the pixel electrode 322. The insulating film 318 can be formed using an organic insulating film, for example.

The insulating film 324 has a function of separating EL layers 326 in adjacent pixels; that is, the insulating film 324 has a function as a partition wall. The insulating film 324 has an insulating property and can be formed using an organic insulating film or an inorganic insulating film, for example. As the organic insulating film, for example, a polyimide-based resin, a polyamide-based resin, an acrylic-based resin, a siloxane-based resin, an epoxy-based resin, a phenol-based resin, or the like can be used. As the inorganic insulating material, silicon oxide, silicon oxynitride, or the like can be used. In particular, a photosensitive organic resin material is preferably used, in which case the insulating film 324 is easily formed.

The opening 352a is formed in the insulating films 306a and 306b over the electrode 304a. The electrode 304a is connected to the electrode 310 through the opening 352a. The openings 352b and 352c are formed in the insulating films 306a and 306b over the electrode 304d. The electrode 304d is connected to the electrode 312a through the openings 352b and 352c. With a plurality of openings such as the openings 352b and 352c formed over the electrode 304d, contact resistance between the electrode 304d and the electrode 312a can be reduced. Note that FIG. 16 illustrates the case of providing two openings, i.e., the openings 352b and 352c. However, the number of openings is not limited thereto. One opening, or three or more openings may be formed.

An opening 356a is formed in the insulating film 318 over the transistor 300a. The opening 356a can shorten the distance between the gate electrode 320 and the oxide semiconductor film 308. Therefore, an electric field applied to the gate electrode 320 can be preferably applied to the oxide semiconductor film 308.

The opening 354 is formed in the oxide insulating film 314 and the nitride insulating film 316 over the electrode 312. The opening 356b is formed in the insulating film 324 over the opening 354. The electrode 312 is electrically connected to the pixel electrode 322 through the openings 354 and 356b.

Note that the description of the semiconductor device in Embodiment 1 can be referred to for materials which can be used for the pixel illustrated in FIGS. 15 and 16. Specifically, the substrate 102 can be referred to for the substrate 302; the gate electrode 104, for the gate electrode 304b and the electrodes 304a, 304c, and 304d; the gate insulating film 106, for the insulating films 306a and 306; the oxide semiconductor film 108, for the oxide semiconductor film 308; the electrodes 110 and 112, for the electrodes 310 and 312; the oxide insulating film 114, for the oxide insulating film 314; the nitride insulating film 116, for the nitride insulating film 316; the insulating film 118, for the insulating film 318; the gate electrode 120 and the conductive film 122 serving as a pixel electrode, for the gate electrode 320 and the pixel electrode 322; and the insulating film 124, for the insulating film 324.

Modification Example

Figure 17:
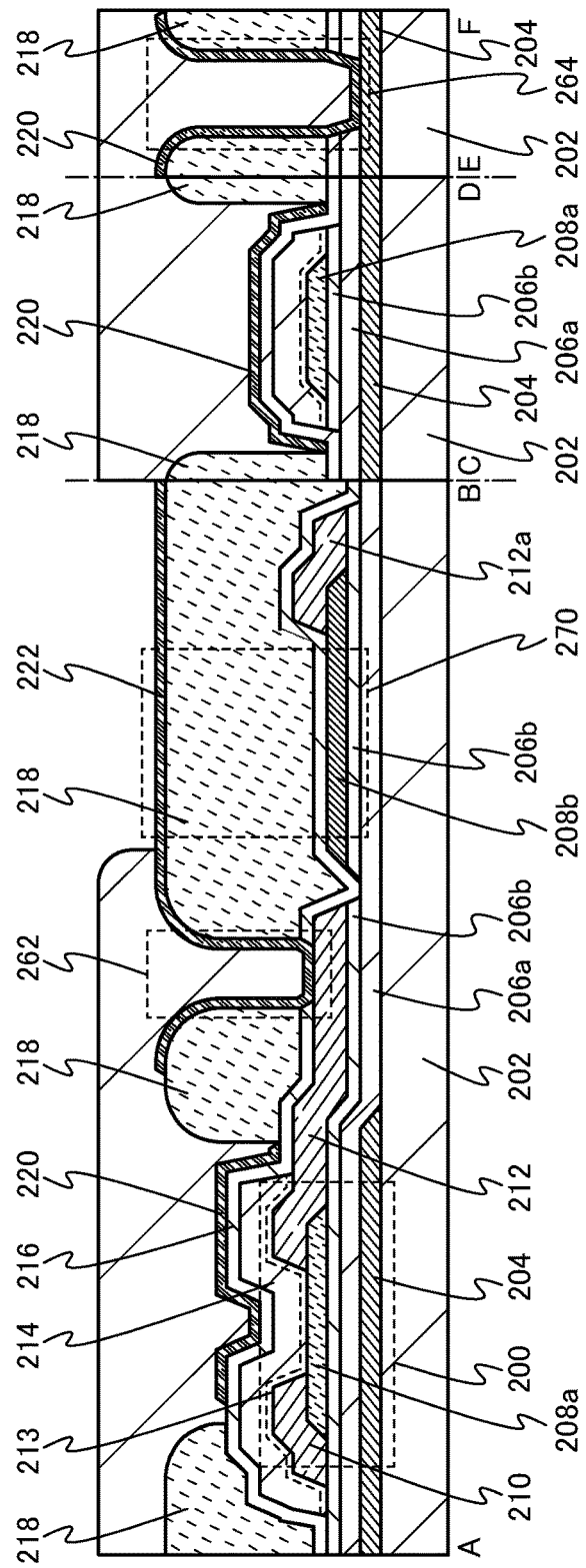
FIG. 17 is a cross-sectional view illustrating one embodiment of a light-emitting device.

Here, a modification example of the pixel 601 shown in FIGS. 13A and 13B is described with reference to FIG. 17. A cross-sectional view of the pixel 601 is shown in FIG. 17. A transistor 200 shown in FIG. 17 is a channel-etched transistor. A cross-sectional view along line A-B shows cross sections of the transistor 200 in a channel length direction, a portion where the transistor 200 is connected to a conductive film 222 serving as a pixel electrode, and a capacitor 270. A cross-sectional view along line C-D shows cross sections of the transistor 200 in a channel width direction. A cross-sectional view along line E-F shows cross sections of a portion where a gate electrode 204 is connected to a gate electrode 220. The transistor 200 shown in FIG. 17 corresponds to the transistor 300a shown in FIG. 13B. The capacitor 270 shown in FIG. 17 corresponds to the capacitor 370 shown in FIG. 13B. In the light-emitting element 350 shown in FIG. 13B, only the conductive film 222 serving as a first electrode is shown, and the EL layer 326 and the second electrode are omitted. Further, the transistor 300b, the transistor 300a, and the like shown in FIG. 13B are omitted.

The transistor 200 illustrated in FIG. 17 is a dual-gate transistor including the gate electrode 204 provided over the substrate 202. The transistor 200 further includes a nitride insulating film 206a formed over the substrate 202 and the gate electrode 204, an oxide insulating film 206b formed over the nitride insulating film 206a, an oxide semiconductor film 208a overlapping the gate electrode 204 with the nitride insulating film 206a and the oxide insulating film 206b provided therebetween, and conductive films 210 and 212 which are in contact with the oxide semiconductor film 208a and serve as a pair of electrodes. An oxide insulating film 213 is formed over the oxide insulating film 206b, the oxide semiconductor film 208a, and the conductive films 210 and 212 serving as a pair of electrodes. An oxide insulating film 214 is formed over the oxide insulating film 213. A nitride insulating film 216 is formed over the nitride insulating film 206a, the oxide insulating film 213, the oxide insulating film 214, and the conductive film 212. An insulating film 218 in which an opening is provided in a position overlapping the oxide semiconductor film 208a is formed over the nitride insulating film 216. In the opening of the insulating film 218, the gate electrode 220 is formed in a position over the nitride insulating film 216 and overlapping the oxide semiconductor film 208a. The conductive film 222 is formed over the insulating film 218 and connected to one of the conductive films 210 and 212 serving as a pair of electrodes (in this structure, connected to the conductive film 212). Note that the conductive film 222 serves as a pixel electrode. The gate electrode 220 and the conductive film 222 are formed in the same step.

As shown in the cross section along E-F, the gate electrode 220 is connected to the gate electrode 204 in an opening 264 provided in the nitride insulating film 206a and the nitride insulating film 216. That is, the potential of the gate electrode 204 and the potential of the gate electrode 220 are the same.

The nitride insulating film 206a and the oxide insulating film 206b serve as a first gate insulating film. The oxide insulating films 213 and 214 and the nitride insulating film 216 serve as a second gate insulating film.

The transistor 200 can be formed in a manner similar to that of the transistor 100 in Embodiment 1. The oxide insulating film 214 is preferably formed using an oxide insulating film containing more oxygen than that in the stoichiometric composition. In the transistor 200, the nitride insulating film 206a and the nitride insulating film 216 are in contact with each other while surrounding the oxide semiconductor film 208a and the oxide insulating films 213 and 214. Thus, the nitride insulating film 206a and the nitride insulating film 216 prevent oxygen contained in the oxide insulating film 213 or the oxide insulating film 214 from being moved to the outside. Consequently, oxygen contained in the oxide insulating film 213 or the oxide insulating film 214 can be efficiently moved to the oxide semiconductor film 208a, so that the amount of oxygen vacancies in the oxide semiconductor film can be reduced, resulting in the transistor having normally-off characteristics. Furthermore, the amount of change in electrical characteristics, typically in threshold voltage, of the transistor by change over time or a stress test can be reduced.

In the channel width direction, the gate electrode 220 faces a side surface of the oxide semiconductor film 208a with side surfaces of the oxide insulating films 213 and 214 provided therebetween. Thus, the transistor can have excellent electric characteristics such as a sharp increase of the drain current at around the threshold voltage. Furthermore, the on-state current and the field-effect mobility of the transistor are high.

In a region between a film 208b having conductivity and the conductive film 222, the nitride insulating film 216 and the insulating film 218 serve as a dielectric. That is, the film 208b having conductivity, the nitride insulating film 216, the insulating film 218, and the conductive film 222 form the capacitor 270. The film 208b having conductivity is formed concurrently with the oxide semiconductor film 208a; thus, the film 208b having conductivity has a light-transmitting property. Therefore, when the conductive film 222 is formed using a light-transmitting conductive film, the capacitor can have a light-transmitting property. Such a structure is preferable in the case of forming a light-emitting device with a bottom-emission structure because the aperture ratio of the pixel is increased.

In the capacitor 270, the film 208b having conductivity is formed by processing an oxide semiconductor film formed concurrently with the oxide semiconductor film 208a. Thus, the film 208b having conductivity includes a metal element similar to that of the oxide semiconductor film 208a. Furthermore, the film 208b having conductivity includes a crystal structure similar to or different from that of the oxide semiconductor film 208a. When an impurity or an oxygen vacancy is included in the oxide semiconductor film formed concurrently with the oxide semiconductor film 208a, the film 208b having conductivity is obtained. Hydrogen is given as an example of the impurity included in the oxide semiconductor film which is to be the film 208b having conductivity. Instead of hydrogen, as the impurity, boron, phosphorus, tin, antimony, a rare gas element, an alkali metal, an alkaline earth metal, or the like may be included.

The oxide semiconductor film 208a and the film 208b having conductivity, which are formed over the oxide insulating film 206b, have different impurity concentrations. Specifically, the impurity concentration of the film 208b having conductivity is higher than that of the oxide semiconductor film 208a. For example, the concentration of hydrogen contained in each of the oxide semiconductor film 208a and the film 208b having conductivity is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. The concentration of hydrogen contained in the film 208b having conductivity is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the film 208b having conductivity is greater than or equal to 2 times, preferably greater than or equal to 10 times that in the oxide semiconductor film 208a.

By exposing an oxide semiconductor film formed concurrently with the oxide semiconductor film 208a to plasma, the oxide semiconductor film can be damaged, so that an oxygen vacancy can be formed. For example, when a film is formed over the oxide semiconductor film by a plasma CVD method or a sputtering method, the oxide semiconductor film is exposed to plasma, thereby forming an oxygen vacancy. Alternatively, in etching process for forming the oxide insulating film 213 and the oxide insulating film 214, the oxide semiconductor film is exposed to plasma, thereby forming an oxygen vacancy. Further alternatively, the oxide semiconductor film is exposed to plasma of, for example, hydrogen, a rare gas, ammonia, a mixed gas of oxygen and hydrogen, thereby forming an oxygen vacancy. As a result, the conductivity of the oxide semiconductor film is increased, so that the oxide semiconductor film becomes the film 208b having conductivity.

That is, the film 208b having conductivity can also be referred to as an oxide semiconductor film having high conductivity. Furthermore, the film 208b having conductivity can also be referred to as a metal oxide film having high conductivity.

In the case where a silicon nitride film is used as the nitride insulating film 216, the silicon nitride film contains hydrogen. When hydrogen in the nitride insulating film 216 is diffused into the oxide semiconductor film formed concurrently with the oxide semiconductor film 208a, hydrogen is bonded to oxygen and electrons serving as carriers are generated in the oxide semiconductor film. When the silicon nitride film is formed by a plasma CVD method or a sputtering method, the oxide semiconductor film is exposed to plasma and oxygen vacancies are generated in the oxide semiconductor film. When hydrogen contained in the silicon nitride film enters the oxygen vacancies, electrons serving as carriers are generated. As a result, the conductivity of the oxide semiconductor film is increased, so that the oxide semiconductor film becomes the film 208b having conductivity.

The resistivity of the film 208b having conductivity is lower than that of the oxide semiconductor film 208a. The resistivity of the film 208b having conductivity is preferably greater than or equal to $1 \times 10^{-8}$ times and less than $1 \times 10^{-1}$ times the resistivity of the oxide semiconductor film 208a. The resistivity of the film 208b having conductivity is typically greater than or equal to $1 \times 10^{-3}$ Ωcm and less than $1 \times 10^4$ Ωcm, preferably greater than or equal to $1 \times 10^{-3}$ Ωcm and less than $1 \times 10^-$Ωcm.

Note that in the step shown in FIGS. 3A and 3B, the oxide insulating films 213 and 214 of one pixel are preferably etched to be separated from oxide insulating films 213 and 214 formed in another pixel. Thus, in the step illustrated in FIGS. 3C and 3D, the oxide semiconductor film formed concurrently with the oxide semiconductor film 208a is in contact with the nitride insulating film 216. Consequently, the oxide semiconductor film formed concurrently with the oxide semiconductor film 208a is increased in conductivity and becomes the film 208b having conductivity.

In the light-emitting device illustrated in this modification example, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of steps for manufacturing the semiconductor device can be reduced. Furthermore, the capacitor has a light-transmitting property because the pair of electrodes has a light-transmitting property. As a result, the area occupied by the capacitor can be increased and the aperture ratio in a pixel can be increased.

Note that the structures, methods, and the like described in this embodiment can be used as appropriate in combination with any of the structures, methods, and the like described in the other embodiments.

Embodiment 4

In this embodiment, an example of an active matrix light-emitting device that is one embodiment of the present invention will be described with reference to FIGS. 18A and 18B.

FIG. 18A is a plan view of a light-emitting device of one embodiment of the present invention. FIG. 18B is a cross-sectional view taken along the dashed-dotted lines A1-A2 and B1-B2 in FIG. 18A.

An active matrix light-emitting device illustrated in FIGS. 18A and 18B includes, over a support substrate 801, a light-emitting portion 802, a driver circuit portion 803 (e.g., scan line driver circuit), a driver circuit portion 804 (e.g., signal line driver circuit), and a sealant 805. The light-emitting portion 802 and the driver circuit portions 803 and 804 are sealed in a space 810 surrounded by the support substrate 801, the sealing substrate 806, and the sealant 805.

The driver circuit portions 803 and 804 can be formed using the transistor described in Embodiment 1. Note that the driver circuit portions or the like may each be divided so that parts of the driver circuit portions or the like face each other with pixels provided therebetween.

The light-emitting portion 802 shown in FIG. 18B includes a plurality of pixels each having a first transistor (not shown) having a function of controlling writing of a data signal, a second transistor 811 having a function of adjusting current flowing in a light-emitting element, and a first electrode 831 which is electrically connected to a wiring (a source electrode or a drain electrode) of the second transistor 811.

The light-emitting element 840 has a top-emission structure and includes the first electrode 831, an EL layer 833, and a second electrode 835. An insulating film 839 covering an end portion of the first electrode 831 and serving as a partition wall is formed.

The transistor 811 has a dual-gate structure and includes, over an insulating film 844, a gate electrode 832 which is formed concurrently with the first electrode 831. When the transistor 811 is provided under the insulating film 839, reflection of external light on the gate electrode 832 can be reduced.

Over the support substrate 801, a lead wiring 809 for connecting an external input terminal through which a signal (e.g., a video signal, a clock signal, a start signal, or a reset signal) or a potential from the outside is transmitted to the driver circuit portions 803 and 804 is provided. Here, an example in which a flexible printed circuit (FPC) 808 is provided as an external input wiring is described.

The driver circuit portions 803 and 804 have a plurality of transistors. FIG. 18B illustrates an example in which the driver circuit portion 803 includes an NMOS circuit having n-channel transistors 852 and 853. A circuit included in the driver circuit portion can be formed with various types of circuits such as a CMOS circuit, a PMOS circuit, or an NMOS circuit. Although a driver-integrated type in which a driver circuit is formed over the substrate over which the light-emitting portion is formed is described in this embodiment, the structure of the present invention is not limited to the driver-integrated type. The driver circuit can be formed over a substrate that is different from the substrate over which the light-emitting portion is formed.

To prevent increase in the number of manufacturing steps, the lead wiring 809 is preferably formed using the same material and the same step(s) as those of the electrode or the wiring in the light-emitting portion or the driver circuit portion. For example, the lead wiring 809 can be formed using the same material in the same step(s) as those of the gate electrode of the transistor included in the light-emitting portion 802 and the driver circuit portion 803.

As the support substrate 801, a substrate having heat resistance high enough to resist the manufacturing process of the light-emitting device can be used. The substrate is not particularly limited in thickness and size as long as it can be used in a manufacturing apparatus.

The support substrate 801 preferably has a gas barrier property. Alternatively, a film having a gas barrier property may be stacked over the support substrate 801. Specifically, when a material having a gas barrier property such that the vapor permeability is lower than or equal to $10^{-5}$ g/m²·day, preferably lower than or equal to $10^{-6}$ g/m²·day, is used, the reliability of the light-emitting device can be improved.

Further, the support substrate 801 may be a flexible substrate. As a flexible substrate, a plastic substrate can be typically given as an example. In addition, a thin glass substrate with a thickness of greater than or equal to 50 μm and less than or equal to 500 μm, a metal foil, or the like can be used.

For example, as a substrate which can be used as the support substrate 801, a non-alkali glass substrate, a barium borosilicate glass substrate, an aluminoborosilicate glass substrate, a ceramic substrate, a quartz substrate, a sapphire substrate, a metal substrate, a stainless-steel substrate, a plastic substrate, a polyethylene terephthalate substrate, a polyimide substrate, or the like can be used.

The structure of the transistors in the driver circuit portion 803 is not particularly limited. Although transistors having a channel-etched bottom gate structure are illustrated as an example in FIG. 18B, the transistors may have a channel-protective bottom gate structure, a self-aligned top gate structure, or a non-self-aligned top gate structure.

A transistor including an oxide semiconductor in a channel formation region has characteristics of very small off-state current in some cases. When such a transistor is used, the capability of holding a signal input to a pixel (capacitor) can be high, so that the frame frequency can be reduced for example in the case of displaying a still image. Low frame frequency enables a reduction in power consumption of the light-emitting device.

The insulating film 839 can be formed using a material for the insulating film 118 in Embodiment 1, as appropriate.

The insulating film 839 is formed to cover an end portion of the first electrode 831. The insulating film 839 is preferably formed to have a curved side surface in order to improve the coverage with the EL layer 833 or the second electrode 835 which is formed over the partition wall.

The insulating film 839 is preferably formed using a material having a low refractive index than the EL layer 833. When the insulating film 839 is formed using such a material, total reflection can be caused at an interface between the EL layer 833 and the insulating film 839 and the amount of light entering the insulating film 839 can be reduced, whereby light extraction efficiency can be increased.

The light-emitting element included in the light-emitting device includes a pair of electrodes (the first electrode 831 and the second electrode 835), and the EL layer 833 between the pair of electrodes. One of the pair of electrodes functions as an anode and the other functions as a cathode.

In the case where the light-emitting element has a top-emission structure, a conductive film that transmits visible light is used for an upper electrode, and a conductive film that reflects visible light is preferably used for a lower electrode. In the case where the light-emitting element has a bottom-emission structure, a conductive film that transmits visible light is used for a lower electrode, and a conductive film that reflects visible light is preferably used for an upper electrode. In the case where the light-emitting element has a dual-emission structure, a conductive film that transmits visible light is used for an upper and a lower electrodes.

When a voltage higher than the threshold voltage of the light-emitting element is applied between the first electrode 831 and the second electrode 835, holes are injected from the first electrode 831 side to the EL layer 833 and electrons are injected from the second electrode 835 side to the EL layer 833. The injected electrons and holes recombine in the EL layer 833 and a light-emitting substance contained in the EL layer 833 emits light.

The EL layer 833 includes a light-emitting layer. In addition to the light-emitting layer, the EL layer 833 may further include one or more layers containing any of the following substances: a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. The above-described layers included in the EL layer 833 can be formed separately by any of the following methods: an evaporation method (including a vacuum evaporation method), a transfer method, a printing method, an inkjet method, a coating method, and the like.

With the first electrode 831 and the second electrode 835 of the light-emitting element 840, a micro resonator (also referred to as microcavity) can be formed. For example, the first electrode 831 is formed using a conductive film which reflects light emitted from the EL layer 833, and the second electrode 835 is formed using a semi-transmissive and semi-reflective, conductive film which reflects part of the light and transmits part of the light.

An optical adjustment layer can be provided between the first electrode 831 and the second electrode 835. The optical adjustment layer is a layer which adjusts the optical path length between the reflective first electrode 831 and the semi-transmissive and semi-reflective second electrode 835. By adjusting the optical adjustment layer, the wavelength of light preferentially extracted from the second electrode 835 can be controlled.

The EL layer can be employed for a material that can be used for the optical adjustment layer. For example, the thickness of the optical adjustment layer may be adjusted using a charge generation region. A region containing a substance having a high hole-transport property and an acceptor substance is especially preferably used for the optical adjustment layer, in which case an increase in drive voltage can be inhibited even when the optical adjustment layer is thick.

Alternatively, for a material that can be used for the optical adjustment layer, a conductive light-transmitting film that transmits light emitted from the EL layer 833 can also be employed. For example, the light-transmitting conductive film is stacked over a surface of the reflective conductive film to form the first electrode 831. Such a structure is preferable because the thickness of an optical adjustment layer of an adjacent first electrode 831 is easily changed.

The oxide insulating film 114 and the nitride insulating film 116 described in Embodiment 1 can be used for the insulating film 844.

As the insulating film 846, an insulating film that functions as a planarization film is preferably selected in order to reduce surface unevenness due to the transistor. The insulating film 118 described in Embodiment 1 can be used as appropriate.

The sealant 805 and the sealing substrate 806 are desirably formed using a material which does not transmit impurities in the air (such as water and/or oxygen) as much as possible. An epoxy-based resin, glass frit, or the like can be used for the sealant 805.

For a material that can be used for the sealing substrate 806, any of the substrate that can be used as the support substrate 801, a plastic substrate formed of polyvinil fluoride (PVF), polyester, acrylic, or the like, fiberglass-reinforced plastics (FRP), or the like can be used.

A light-transmitting material may be contained in the space 810 where the structure formed on the support substrate 801 side and the structure formed on the sealing substrate 806 side are not in contact with each other.

The light-transmitting material may be a material that reacts with or adsorbs impurities (such as water and/or hydrogen) which lower the reliability of the light-emitting element. Thus, impurities preferentially react with or are preferentially adsorbed by the material contained in the space 810 and become inactive before lowering the reliability of the light-emitting element. Accordingly, reliability of the light-emitting device can be increased.

As the light-transmitting material, a substance having a high hole-transport property, a light-emitting substance, a host material, a substance having a high electron-transport property, a substance having a high electron-injection property, an accepter substance, and/or the like can be used.

Specifically, a conductive high molecule, poly(3,4-ethylenedioxythiophene)/poly(styrenesulfonic acid) (PEDOT/PSS), a desiccating agent, a material which can be used in the EL layer 833, 4,4'-bis[N-(1-naphthyl)-N-phenylamino]biphenyl (abbreviation: NPB or α-NPD), tris(8-quinolinolato)aluminum(III) (abbreviation: Alq), or the like can be used.

The light-transmitting material can optically connect the second electrode 835 to the sealing substrate 806 (including the structure formed on the sealing substrate 806). Accordingly, a drastic change in the refractive index (also referred to as a step portion in the refractive index) of light emitted from the light-emitting element 840 can be suppressed in the optical path from the second electrode 835 to the sealing substrate 806, whereby light of the light-emitting element 840 can be efficiently extracted to the sealing substrate 806 through the second electrode 835. Thus, luminous efficiency of the light-emitting device can be improved.

The light-transmitting material is preferably a material having a higher refractive index than the second electrode 835. With such a material, total reflection at an interface between the second electrode 835 and the material can be inhibited, whereby light extraction efficiency can be increased.

Note that as the material that can optically connect the second electrode 835 to the sealing substrate 806, as well as the above-described materials, a liquid crystal material, a fluorine-based inactive liquid (such as perfluorocarbon), or a light-transmitting resin can be used. These materials may be used after impurities which lower the reliability of the light-emitting element are removed therefrom, as appropriate. In addition, a material that reacts with or adsorbs the impurities may be dispersed in the above materials.

As examples of a liquid crystal material, any of the following can be used: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and a mixed material such as a mixture of any of the above-described liquid crystal materials and a chiral material.

The color filter 866 is provided in order to adjust the color of light emitted from a light source to increase the color purity. For example, in a full-color display device using white light-emitting elements, a plurality of pixels provided with color filters of different colors are used. In that case, the color filters may be those of three colors of R (red), G (green), and B (blue) or four colors (yellow (Y) in addition to these three colors). Further, a white (W) pixel may be added to R, G, and B pixels (and a Y pixel).

A black matrix 864 is provided between the adjacent color filters 866. The black matrix 864 blocks light emitted from an adjacent pixel, thereby preventing color mixture between the adjacent pixels. The black matrix 864 may be provided only between adjacent pixels of different emission colors and not between pixels of the same emission color. Here, the color filter 866 is provided so that its end portions overlap with the black matrix 864, whereby light leakage can be reduced.

The black matrix 864 can be formed using a material that blocks light from a light source, for example, a metal material or a resin material including a pigment. Note that when the black matrix 864 is provided in a region other than the light-emitting portion 802, such as a driver circuit portion, undesired leakage of guided light or the like can be prevented.

As illustrated in FIG. 18B, by providing an overcoat 868 covering the color filter 866 and the black matrix 864, an impurity such as a pigment included in the color filter 866 or the black matrix 864 can be prevented from diffusing into the light-emitting element or the like. For the overcoat 868, a light-transmitting inorganic or organic insulating material can be used.

This embodiment can be combined with any of the other embodiments in this specification as appropriate.

Embodiment 5

In this embodiment, electronic devices in which a light-emitting device of one embodiment of the present invention can be incorporated will be described.

Examples of the electronic device to which the light-emitting device is applied include television devices (also referred to as TV or television receivers), monitors for computers and the like, cameras such as digital cameras and digital video cameras, digital photo frames, mobile phones (also referred to as portable telephone devices), portable game machines, portable information terminals, audio reproducing devices, large game machines such as pin-ball machines, and the like. Specific examples of these electronic devices are illustrated in FIGS. 19A to 19F.

Figure 19A:
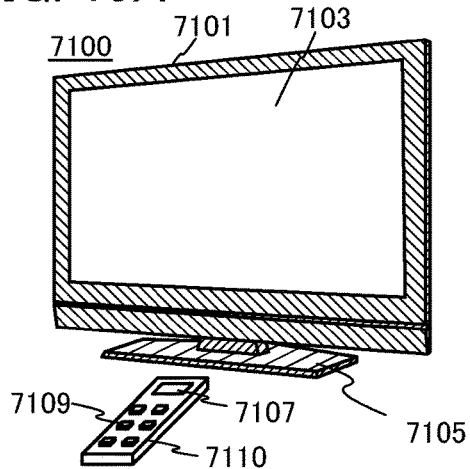
FIGS. 19A to 19F each illustrate an example of an electronic device.

FIG. 19A illustrates an example of a television device. In the television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Figure 19B:
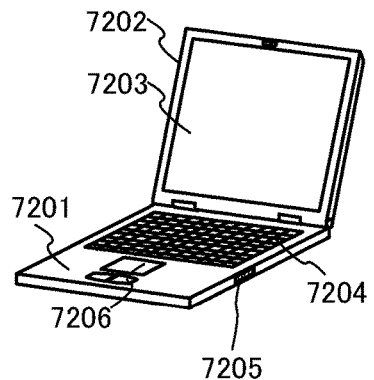

FIG. 19B illustrates a computer, which includes a main body 7201, a housing 7202, a display portion 7203, a keyboard 7204, an external connecting port 7205, a pointing device 7206, and the like. Note that this computer is manufactured using the light-emitting device for the display portion 7203.

Figure 19C:
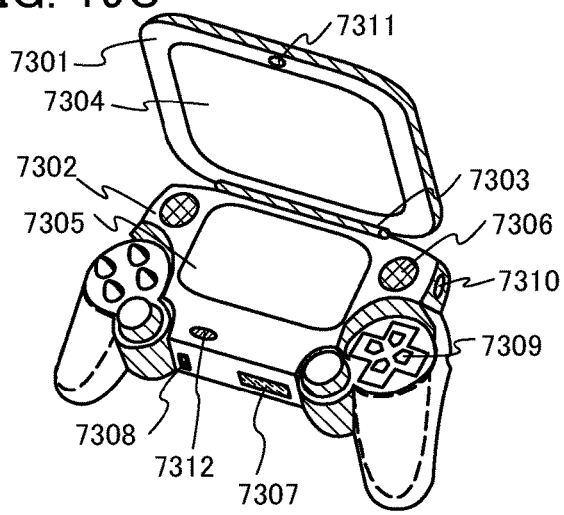

FIG. 19C illustrates a portable game machine, which includes two housings, i.e., a housing 7301 and a housing 7302, connected to each other via a joint portion 7303 so that the portable game machine can be opened or closed. A display portion 7304 is incorporated in the housing 7301 and a display portion 7305 is incorporated in the housing 7302. In addition, the portable game machine illustrated in FIG. 19C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), and a microphone 7312), and the like. Needless to say, the structure of the portable game machine is not limited to the above as long as a light-emitting device can be used for at least either the display portion 7304 or the display portion 7305, or both, and may include other accessories as appropriate. The portable game machine illustrated in FIG. 19C has a function of reading out a program or data stored in a storage medium to display it on the display portion, and a function of sharing information with another portable game machine by wireless communication. The portable amusement machine illustrated in FIG. 19C can have various functions without limitation to the above.

Figure 19D:
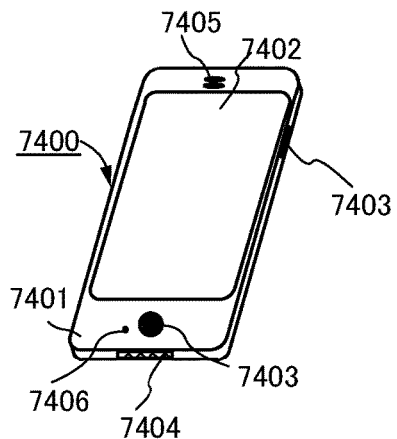

FIG. 19D illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 19D is touched with a finger or the like, data can be input into the mobile phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 19E:
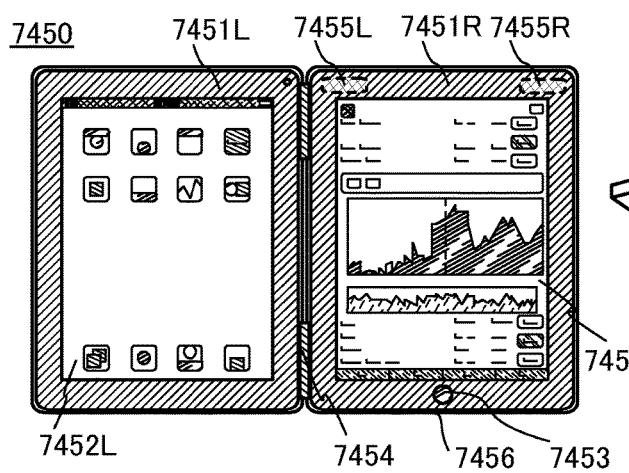

FIG. 19E illustrates an example of a folding computer. A folding computer 7450 includes a housing 7451L and a housing 7451R connected by hinges 7454. The computer 7450 further includes an operation button 7453, a left speaker 7455L, and a right speaker 7455R. In addition, a side surface of the computer 7450 is provided with an external connection port 7456, which is not illustrated. Note that when the computer 7450 is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which data can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, when a detection device including a sensor for detecting inclination, such as a gyroscope or an acceleration sensor, is provided, the orientation of the display screen can be automatically changed by determining the orientation of the computer 7450 (whether the computer 7450 is placed horizontally or vertically).

Furthermore, the computer 7450 can be connected to a network. The computer 7450 not only can display data on the Internet but also can be used as a terminal which controls another electronic device connected to the network from a distant place.

Figure 19F:
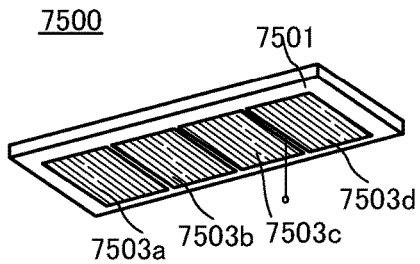

FIG. 19F illustrates an example of a lighting device. In a lighting device 7500, light-emitting devices 7503a, 7503b, 7503c, and 7503d of one embodiment of the present invention are incorporated in a housing 7501 as light sources. The lighting device 7500 can be attached to a ceiling, a wall, or the like.

This embodiment can be combined with any of the other embodiments in this specification as appropriate.

This application is based on Japanese Patent Application serial no. 2013-105683 filed with Japan Patent Office on May 18, 2013, the entire contents of which are hereby incorporated by reference.

What is claimed is:

1. A semiconductor device comprising:
   a substrate;
   a first insulating film over the substrate;
   a second insulating film over the first insulating film, the second insulating film being an inorganic insulating film;
   a third insulating film over the second insulating film, the third insulating film being an organic insulating film;
   a transistor in a pixel portion, the transistor comprising:
      a first gate electrode over the substrate;
      the first insulating film over the first gate electrode;
      a semiconductor layer over the first insulating film and overlapping the first gate electrode;
      a source electrode and a drain electrode each in electrical contact with the semiconductor layer;
      the second insulating film over the semiconductor layer, the source electrode, and the drain electrode; and
      a second gate electrode overlapping the semiconductor layer with the second insulating film therebetween;
   in the third insulating film, a first opening overlapping the semiconductor layer and a second opening overlapping one of the source electrode and the drain electrode; and
   a pixel electrode over the third insulating film, in the second opening, and in electrical contact with the one of the source electrode and the drain electrode in a third opening formed in the second insulating film, the third opening overlapping with the second opening,
   wherein the second gate electrode is in the first opening, and
   wherein the second gate electrode and the pixel electrode define respectively a first portion and a second portion of a same conductive film.

2. The semiconductor device according to claim 1, wherein the pixel electrode is in direct contact with the one of the source electrode and the drain electrode in the third opening.

3. The semiconductor device according to claim 1, wherein the second insulating film is an inorganic film, and
   wherein the third insulating film is an organic film.

4. The semiconductor device according to claim 1, further comprising a fourth insulating film formed on the third insulating film,
   wherein, in a cross-sectional view showing the semiconductor layer, top and side surfaces of the second gate electrode are covered with the fourth insulating film so that the second gate electrode appears sealed by the second insulating film and the fourth insulating film.

5. The semiconductor device according to claim 1, further comprising:
an electrode overlapping the pixel electrode; and
an EL layer between the pixel electrode and the electrode.

6. The semiconductor device according to claim 1,
wherein the semiconductor layer is an oxide semiconductor layer.

7. The semiconductor device according to claim 1 being an active matrix light-emitting device.

8. The semiconductor device according to claim 1,
wherein the second gate electrode faces a side surface of the semiconductor layer with the second insulating film therebetween.

9. A semiconductor device comprising:
a substrate;
a first insulating film over the substrate;
a second insulating film over the first insulating film, the second insulating film being an inorganic insulating film;
a third insulating film over the second insulating film, the third insulating film being an organic insulating film;
a transistor in a pixel portion, the transistor comprising:
　a first gate electrode over the substrate;
　the first insulating film over the first gate electrode;
　an oxide semiconductor layer over the first insulating film and overlapping the first gate electrode;
　a source electrode and a drain electrode each in direct contact with the oxide semiconductor layer;
　the second insulating film over the oxide semiconductor layer, the source electrode, and the drain electrode; and
　a second gate electrode overlapping the oxide semiconductor layer and the first gate electrode, with the second insulating film between the second gate electrode and the oxide semiconductor layer;
in the third insulating film, a first opening overlapping the oxide semiconductor layer and a second opening overlapping one of the source electrode and the drain electrode; and
a pixel electrode over the third insulating film, in the second opening, and in direct contact with the one of the source electrode and the drain electrode in a third opening formed in the second insulating film, the third opening overlapping with the second opening,
wherein the second gate electrode is in the first opening, and
wherein the second gate electrode and the pixel electrode define respectively a first portion and a second portion of a same conductive film.

10. The semiconductor device according to claim 9,
wherein the second insulating film is an inorganic film, and
wherein the third insulating film is an organic film.

11. The semiconductor device according to claim 9, further comprising a fourth insulating film formed on the third insulating film,
wherein, in a cross-sectional view showing the semiconductor layer, top and side surfaces of the second gate electrode are covered with the fourth insulating film so that the second gate electrode appears sealed by the second insulating film and the fourth insulating film.

12. The semiconductor device according to claim 9, further comprising:
an electrode overlapping the pixel electrode; and
an EL layer between the pixel electrode and the electrode.

13. The semiconductor device according to claim 9 being an active matrix light-emitting device.

14. The semiconductor device according to claim 9,
wherein the second gate electrode faces a side surface of the oxide semiconductor layer with the second insulating film therebetween.

* * * * *